United States Patent
Ara et al.

(10) Patent No.: US 6,625,789 B2
(45) Date of Patent: Sep. 23, 2003

(54) COMPUTER-READABLE MEDIUM FOR RECORDING INTERFACE SPECIFICATIONS

(75) Inventors: Koji Ara, Kokubunji (JP); Kei Suzuki, Kodaira (JP); Kazuo Yano, Hino (JP)

(73) Assignee: Hitachi, Ltd., Tokyo (JP)

( * ) Notice: Subject to any disclaimer, the term of this patent is extended or adjusted under 35 U.S.C. 154(b) by 262 days.

(21) Appl. No.: 09/810,486

(22) Filed: Mar. 19, 2001

(65) Prior Publication Data

US 2001/0054173 A1 Dec. 20, 2001

(51) Int. Cl.[7] .............................................. G06F 17/50
(52) U.S. Cl. ................... 716/7; 716/4; 716/11; 703/16
(58) Field of Search ...................... 716/7, 4, 11; 703/16

(56) References Cited

U.S. PATENT DOCUMENTS

| | | | | |
|---|---|---|---|---|
| 4,855,726 A | * | 8/1989 | Nishio | 345/440 |
| 4,862,347 A | * | 8/1989 | Rudy | 703/14 |
| 5,231,589 A | * | 7/1993 | Itoh et al. | 716/12 |

(List continued on next page.)

FOREIGN PATENT DOCUMENTS

| | | | | | |
|---|---|---|---|---|---|
| JP | 02268332 A | * | 11/1990 | | G06F/9/44 |
| JP | 04255072 A | * | 9/1992 | | G06F/15/60 |
| JP | 05210703 A | * | 8/1993 | | G06F/15/60 |
| JP | 06028160 A | * | 2/1994 | | G06F/9/06 |
| JP | 06035986 A | * | 2/1994 | | G06F/15/60 |
| JP | 06160119 A | * | 6/1994 | | G01D/7/00 |
| JP | 06175785 A | * | 6/1994 | | G06F/3/06 |
| JP | 07281882 A | * | 10/1995 | | G06F/9/06 |
| JP | 2000048064 A | * | 2/2000 | | G06F/17/50 |
| WO | WO 9853413 A1 | * | 11/1998 | | G06F/17/50 |

OTHER PUBLICATIONS

Ebihara, Yuji, Japanese Pantent No. JP–361,009,761–A, published Jan. 17, 1986, abstract only.*
NA84123759, "PDQROUTE—a Rapid Line Router for Generating Interconnections on a Logic Diagram", IBM Technical Disclosure Bulletin, vol. 27, No. 7A, Dec. 1984, pp. 3759–3768 (13 pages).*
Eltoft et al., "A New Neural Network for Cluster–Detection–and–Labeling", IEEE Transactions on Neural Networks, vol. 9, No. 5, Sep. 1998, pp. 1021–1035.*
Suzuki et al., "OwL: An Interface Description Language for IP Reuse", Proceedings of the IEEE 1999 Custom Integrated Circuits, May 16, 1999, pp. 403–406.*

*Primary Examiner*—Matthew Smith
*Assistant Examiner*—Phallaka Kik
(74) *Attorney, Agent, or Firm*—Miles & Stockbridge P.C.

(57) ABSTRACT

A storage medium readable by a computer for storing a circuit module's interface information, a connection-verifying method for determining whether or not a first circuit module can be connected to a second circuit module and a presentation method for a circuit module's interface information, utilize the interface information comprising high-level combinations, each combination including first identifier sets and second identifier sets, wherein each of the first identifier sets is a combination pattern of values of signals, each signal appearing at a predetermined time at one of ports pertaining to a first port set of the circuit module, and wherein each of the second identifier sets is a combination pattern of values of signals, each signal appearing at a predetermined time at one of ports pertaining to a second port set of the circuit module.

10 Claims, 18 Drawing Sheets

U.S. PATENT DOCUMENTS

| | | | | |
|---|---|---|---|---|
| 5,426,768 A | * | 6/1995 | Kanazawa | 703/16 |
| 5,452,226 A | * | 9/1995 | Hooper et al. | 716/18 |
| 5,490,266 A | * | 2/1996 | Sturges | 703/15 |
| 5,517,658 A | * | 5/1996 | Gluss et al. | 716/6 |
| 5,568,397 A | * | 10/1996 | Yamashita et al. | 716/11 |
| 5,734,572 A | * | 3/1998 | Guignet | 700/97 |
| 5,909,374 A | * | 6/1999 | Matsunaga | 716/19 |
| 5,926,398 A | * | 7/1999 | Nakamura | 716/10 |
| 5,949,691 A | * | 9/1999 | Kurosaka et al. | 716/5 |
| 6,123,734 A | * | 9/2000 | Sato | 703/15 |
| 6,163,763 A | * | 12/2000 | Cox et al. | 703/17 |
| 6,243,852 B1 | * | 6/2001 | Yoshikawa | 716/18 |
| 6,263,301 B1 | * | 7/2001 | Cox et al. | 703/14 |
| 6,272,671 B1 | * | 8/2001 | Fakhry | 716/18 |
| 6,292,925 B1 | * | 9/2001 | Dellinger et al. | 716/8 |
| 6,427,222 B1 | * | 7/2002 | Shau | 716/4 |
| 6,456,961 B1 | * | 9/2002 | Patil et al. | 703/14 |
| 6,470,478 B1 | * | 10/2002 | Bargh et al. | 716/4 |
| 6,477,698 B1 | * | 11/2002 | Shalish | 716/18 |
| 6,505,338 B1 | * | 1/2003 | Suzuki et al. | 716/18 |
| 2003/0070154 A1 | * | 4/2003 | Suzuki et al. | 716/18 |

* cited by examiner

FIG. 11

| T1 | SW1 | ATB1 |
|----|-----|------|
| T2 | SW2 | ATB2 |
| T3 | SW3 | ATB3 |
| T4 | SW4 | ATB4 |
| TS | TS  | TS   |

|    |     | T1   | T2   | TS   |
|----|-----|------|------|------|
|    |     | TM1  | TM2  | TM3  |
| S1 | CN1 | LV11 | LV12 | LV13 |
| S2 | CN2 | LV21 | LV22 | LV23 |
| TS | TS  | TS   | TS   | TS   |

| F1 | SN11 | SN12 | SN13 | TS   |    |
|----|------|------|------|------|----|
| F2 | SN21 | SN22 | SN23 | SN24 | TS |
| F3 | SN31 | SN32 | TS   |      |    |
| F4 | SN41 | SN42 | SN43 | TS   |    |
| TS |      |      |      |      |    |

| FS1 | FS2 | FS3 | FS4 | FS5 | TS |

COMPUTER-READABLE MEDIUM FOR RECORDING INTERFACE SPECIFICATIONS

FIELD OF THE INVENTION

In general, the present invention relates to a technology for defining specifications of interface portions of plural circuit modules and making connection between the circuit modules easy by using the specifications in an integrated-circuit system or a digital system having the circuit modules connected to each other. More particularly, the present invention relates to a storage medium for recording the specifications and a method of presenting information defining the specifications.

BACKGROUND OF THE INVENTION

With the increased scale of LSI integration, it becomes possible to include most elements required in the configuration of a system in a single semiconductor chip. When designing an LSI having elements of a large-scale system, it is possible to reduce the design cost and the number of design works by utilizing already designed circuit modules owned as assets or circuit modules purchased from vendors in the design. One of biggest challenges encountered in such a design technique is how to make the already designed circuit modules reusable. One of solutions to the problem of the challenge is described in a reference authored by Kei Suzuki, the inventor of the present invention. The reference having a title of "OwL: An Interface Description Language for IP Reuse" was presented to a Custom Integrated Circuit Conference in the year of 1999. On pages 403 to 406, there are described values of signals appearing at input/output ports of each function of every circuit module at particular times. By expressing an operation of a circuit module in terms of specifications or functions and timing charts of the circuit module in a computer by using a state transition machine, it is thereby possible to use the computer as a tool for aiding the designer understand the specifications of the circuit module. In addition, the reference also describes automation of design works such as verification for feasibility to connect 2 given circuit modules and a synthesis of signal patterns.

With the method of expressing module specifications based on the proposed conventional state machine, however, a combination of signal values observed at particular times during the operation of a circuit module is expressed as 1 transition of the state machine For this reason, first of all, it is necessary to define a combination of possible signal values as a transition. Assume for example that a combination of values of signals controlling an operation mode of a circuit is defined. Even if the value of only one of the signals changes, a new combination of the signals with the values of the remaining signals unchanged needs to be defined. This definition entails a large number of man-months required for a module with a large number of ports. A problem similar to the one described above rises in the case of a module having plural interfaces or a module having plural sub-modules. That is, when expressing all interfaces of a module, it is necessary to define all combinations of all possible values of all signals generated by the module as a whole. Thus, a person receiving specifications of modules must define combinations from the interfaces by considering possible signal states for each unit time, entailing a large number of man-months needed during the work to synthesize the interfaces. In addition, there is also a shortcoming that, after the interfaces are synthesized, functions developed at each of the interfaces are difficult to recognize. On the other hand, specifications can be defined for each interface In this case, however, there is raised a problem of impossibility to grasp an interface in a module as a whole.

Moreover, in the method of expressing module specifications based on the proposed conventional state machine, a combination of signal values at a certain particular time must be defined. Thus, there was adopted a protocol difficult to express. Determination of parity of a data signal in a parity signal of a PCI bus always lagging by 1 cycle is an example of this protocol. In order to express this protocol by adopting the conventional method, it is necessary to store the value of a data signal in a variable for each cycle and to carry out processing by referencing the variable. Furthermore, a sequence of operations to store the value of a data signal in a variable and to reference the variable must be controlled correctly.

In addition, in the conventional method to express specifications of a circuit module, the only information following signal variations is an identifier name. In the present state of the art, the meanings of a signal variation and a function related to the signal variation are not known to the user. For example, it is impossible to determine whether the user is capable of directly using a function of a circuit module or the function is merely a portion of a certain function and cannot thus be used directly by the user. Moreover, in the method of expressing module specifications based on the proposed conventional state machine, a sequence of signal variations from the start of the operation of a circuit module is defined so that it is difficult to express a discontinued operation In the event of an error occurring during an operation of an actual circuit or at an intentional hardware/software reset, the operation may be restarted from an initial state. In order to express this operation by using the conventional method, all functions are required to be terminatable at any time.

SUMMARY OF THE INVENTION

An object of the present invention addressing the problems described above is to provide a storage medium for recording definitions of interface specifications, information transmission media and an information presentation method, which require no large number of man-months despite a large number of circuit-module ports.

Another object of the present invention is to provide a storage medium for recording definitions of interface specifications, information transmission media and an information presentation method, which allow all interfaces of a circuit module to be identified with ease.

In order to achieve the objects described above, in accordance with a representative aspect of the present invention discovered by the inventor, there are provided a method for presenting interface information of a circuit module, a computer-readable storage medium used for storing the interface information and media for disseminating the interface information The interface information has high-level combinations each including first identifier sets and second identifier sets where:

the first identifier sets are each a combination pattern of values of signals each appearing at a predetermined time at one of ports pertaining to a first port set of the circuit module; and the second identifier sets are each a combination pattern of values of signals each appearing at a predetermined time at one of ports pertaining to a second port set of the circuit module.

Information prescribed in each of the high-level combinations each including the first identifier sets associated with the port set and the second identifier sets associated with the second port set defines an intergroup-level function of the circuit module.

In accordance with another aspect of the present invention, there are provided a method for presenting interface information of a circuit module, a computer-readable storage medium used for storing the interface information and media for disseminating the interface information. The interface information stored in the storage medium has high-level combinations each including first identifier sets and second identifier sets where:

the first identifier sets are each a combination pattern of values of signals each appearing at a predetermined time at one of ports pertaining to a first port set of the circuit module; and the second identifier sets are each a combination pattern of values of signals each appearing at a predetermined time at one of ports pertaining to a second port set of the circuit module.

Interface information of the first port set and interface information of the second port set define a function of the module circuit where the interface information of the first port set is a chronological sequence of the high-level combinations each including the first identifier sets associated with the port set whereas the interface information of the second port set is a chronological sequence of the high-level combinations each including the second identifier sets associated with the second port set.

In accordance with a still other aspect of the present invention, there is provided a circuit module's interface information having a chronological sequence of identifiers each representing a combination pattern of values of signals each appearing at a first predetermined time at one of ports pertaining to a first port set of the circuit module and a combination pattern of values of signals each appearing at a second predetermined time different from the first predetermined time at one of ports pertaining to a second port set of the circuit module.

In accordance with a further aspect of the present invention, there is provided a storage medium for recording:

a set of identifiers each representing a combination pattern of values of signals each appearing at a predetermined time at one of ports pertaining to any port set of the circuit module; and a set of definitions each defining a function of the circuit module as a chronological sequence of the identifiers included in the set of identifiers, wherein the definitions each include:
information indicating whether or not resetting of the function is possible; and
information indicating a parallel or serial format.

In accordance with a still further aspect of the present invention, there is provided a connection-verifying method for determining whether or not a first circuit module can be connected to a second circuit module, the connection-verifying method having the processing steps of:

verifying existence of a relation between a function of the first circuit module and a function of the second circuit module; and finding arrival steps of the function of the first circuit module and the function of the second circuit module by using a chronological array of identifiers each representing the function of the first circuit module and a chronological array of identifiers representing the function of the second circuit module; and determining whether or not the first circuit module can be connected to the second circuit module in dependence on whether or not the arrival step of the function of the first circuit module overlaps the arrival step of the function of the second circuit module, wherein:
the processing steps are based on interface information of the first circuit module and interface information of the second circuit module;

the interface information of the first circuit module has high-level combinations each including first identifier sets and second identifier sets where:

the first identifier sets are each a combination pattern of values of signals each appearing at a predetermined time at one of ports pertaining to a first port set of the first circuit module, whereas the second identifier sets are each a combination pattern of values of signals each appearing at a predetermined time at one of ports pertaining to a second port set of the second circuit module; and the interface information of the second circuit module has high-level combinations each including third identifier sets and fourth identifier sets where:

the third identifier sets are each a combination pattern of values of signals each appearing at a predetermined time at one of ports pertaining to a third port set of the second circuit module, whereas the fourth identifier sets are each a combination pattern of values of signals each appearing at a predetermined time at one of ports pertaining to a fourth port set of the second circuit module It should be noted that the above and other objects of the present invention as well as novel features of the invention for achieving the objects will become apparent from a study of this specification with reference to accompanying diagrams.

BRIEF DESCRIPTION OF THE DRAWINGS

FIG. 11 is diagram showing a data structure in a storage medium used for storing interface-definition-prescribing information in accordance with the third embodiment;

DETAILED DESCRIPTION OF THE PREFERRED EMBODIMENTS

Preferred embodiments of the present invention are described by referring to the diagrams.

Figure 1:
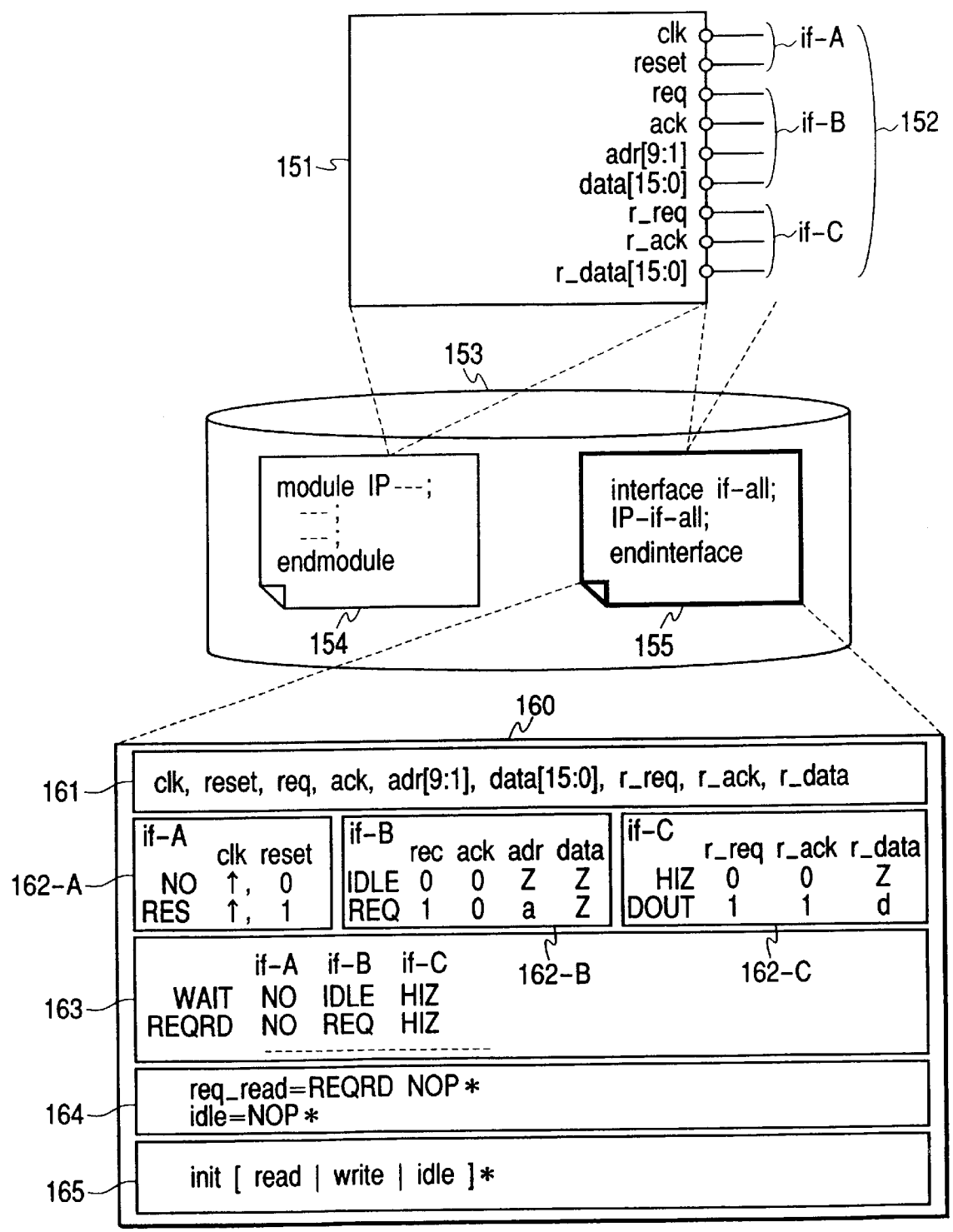
FIG. 1 is an explanatory diagram showing a first embodiment of the present invention.

FIG. 1 is an explanatory diagram showing a first embodiment of the present invention A logic circuit 151 shown in FIG. 1 has an input/output-signal interface 152 for inputting and outputting signals. The logic circuit 101 is typically a circuit module forming a system LSI. In particular, the input/output-signal interface 152 has a first interface if-A including a clock port clk, a second interface if-B including an address port adr and a data port data and a third interface if-C including an r_req port. The assignment of ports in the embodiment is typical to the bitter end. That is, neither the number of ports in a port set nor the number of port sets is prescribed particularly. In addition, a circuit module can be provided with ports other than those employed in the embodiment without causing a problem. Moreover, a port in this specification does not necessarily refer to a bonding pad or the like created on a semiconductor chip and used for connection with a component outside the chip. Instead, such a port implies a general portion provided on a circuit module in a chip and used for connection with a component outside the chip. That is, there is no description prescribing the material or the like of a port. In other words, any material can be used as long as the material is conductive. It should be noted that grouping of ports provided in general by the present invention will be described later. Data 155 prescribing definitions of interfaces described above and data 154 prescribing the structure or the behavior of a logic circuit are stored in a storage medium 153 and can be read out by a computer.

The data stored in the storage medium shown in FIG. 1 is explained in concrete terms. The data 154 prescribing the structure and/or the behavior of the logic circuit 151 includes an array of ports of the logic circuit 151, definitions of the ports and a definition of a circuit IP. The data 155 includes information on all the ports and information on IP interfaces. Reference numeral 160 denotes information prescribing definitions of interfaces included in the data 155. The interface-definition-prescribing information 160 includes port-definition-prescribing information 161, pieces of signal-value-definition-prescribing information 162-A, 162-B and 162-C, generalized-signal-value-definition-prescribing information 163, function-definition-prescribing information 164 and generalized-function-definition-prescribing information 165.

The port-definition-prescribing information 161 may prescribe the same definitions of ports of the logic circuit as those in the data 154. The pieces of signal-value-definition-prescribing information 162-A, 162-B and 162-C prescribe values of signals appearing at the port sets if-A, if-B and if-C. The generalized-signal-value-definition-prescribing information 163 includes data prescribing connections between ports or between interfaces. The function-definition-prescribing information 164 defines a sequence of signals constituting functions of the logic circuit by using a series of symbols defined by the pieces of signal-value-definition-prescribing information 162-A, 162-B and 162-C. The generalized-function-definition-prescribing information 165 defines a function of the logic circuit as a whole by using the function-definition-prescribing information 164.

Figure 2:
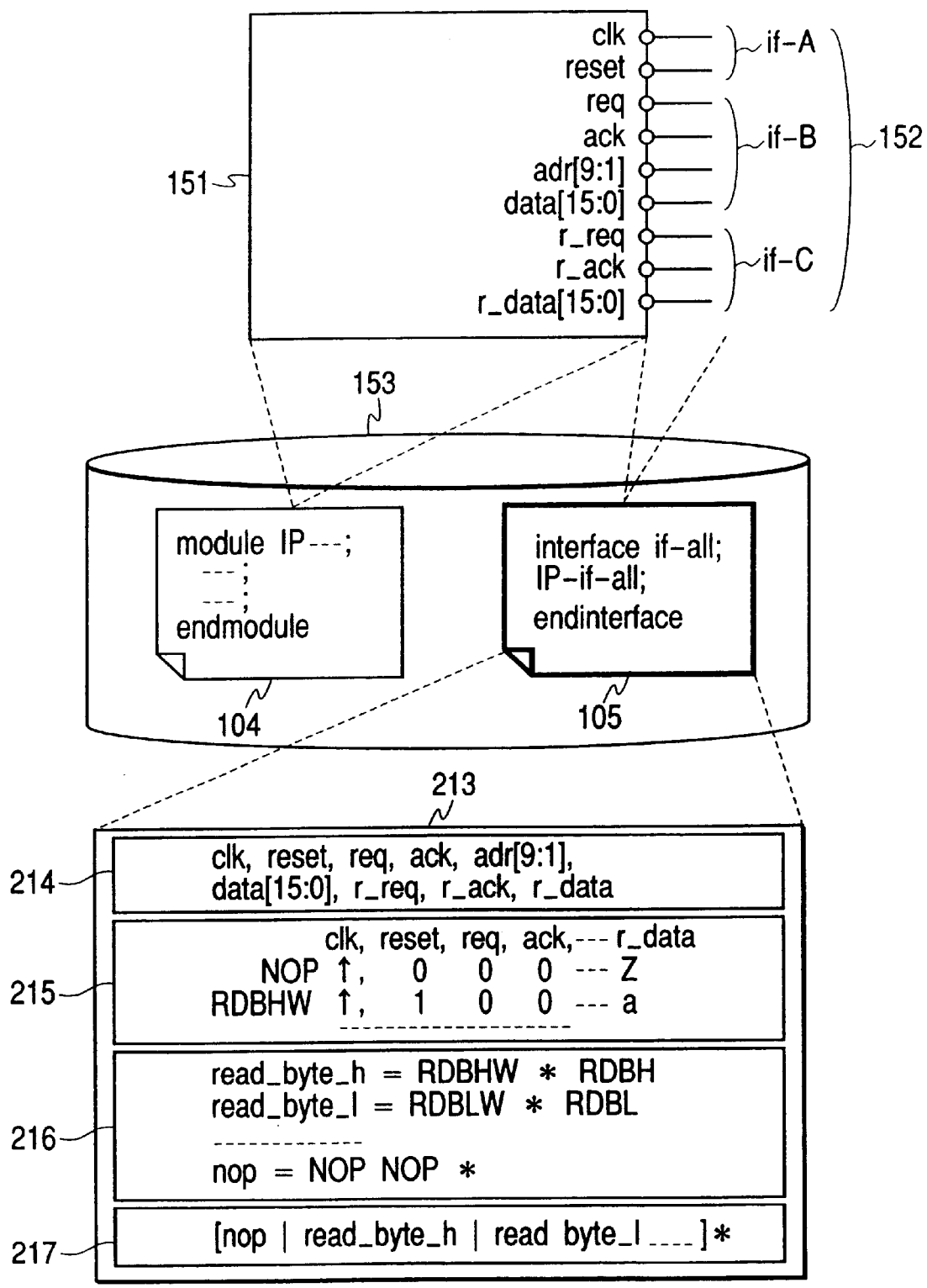
FIG. 2 is a diagram showing a technique of defining interfaces.

As a method of describing information defining plural interfaces of the logic circuit 151 as shown in FIG. 1, there is adopted a conventional technique whereby signal-value-defining information 215 covers all ports as a single set for the whole circuit as shown in FIG. 2 instead grouping the ports into plural sets each pertaining to one of the interfaces. There is also an alternative technique whereby definitions are prescribed for individual interfaces as denoted by reference numerals 1107, 1108 and 1109 shown in FIG. 3. On the other hand, the embodiment of the present invention shown in FIG. 1 is characterized in that:

for each port set, combinations of possible signal values observed at specific times and their identifiers are stored in a storage medium as a piece of signal-value-definition-prescribing information 162 for ports of each port set;

information covering identifiers representing combinations of values of signals appearing at different port sets is stored as the generalized-signal-definition-prescribing information 163; and interface information created from a series of times for the identifiers is also stored in the storage medium.

Figure 4:
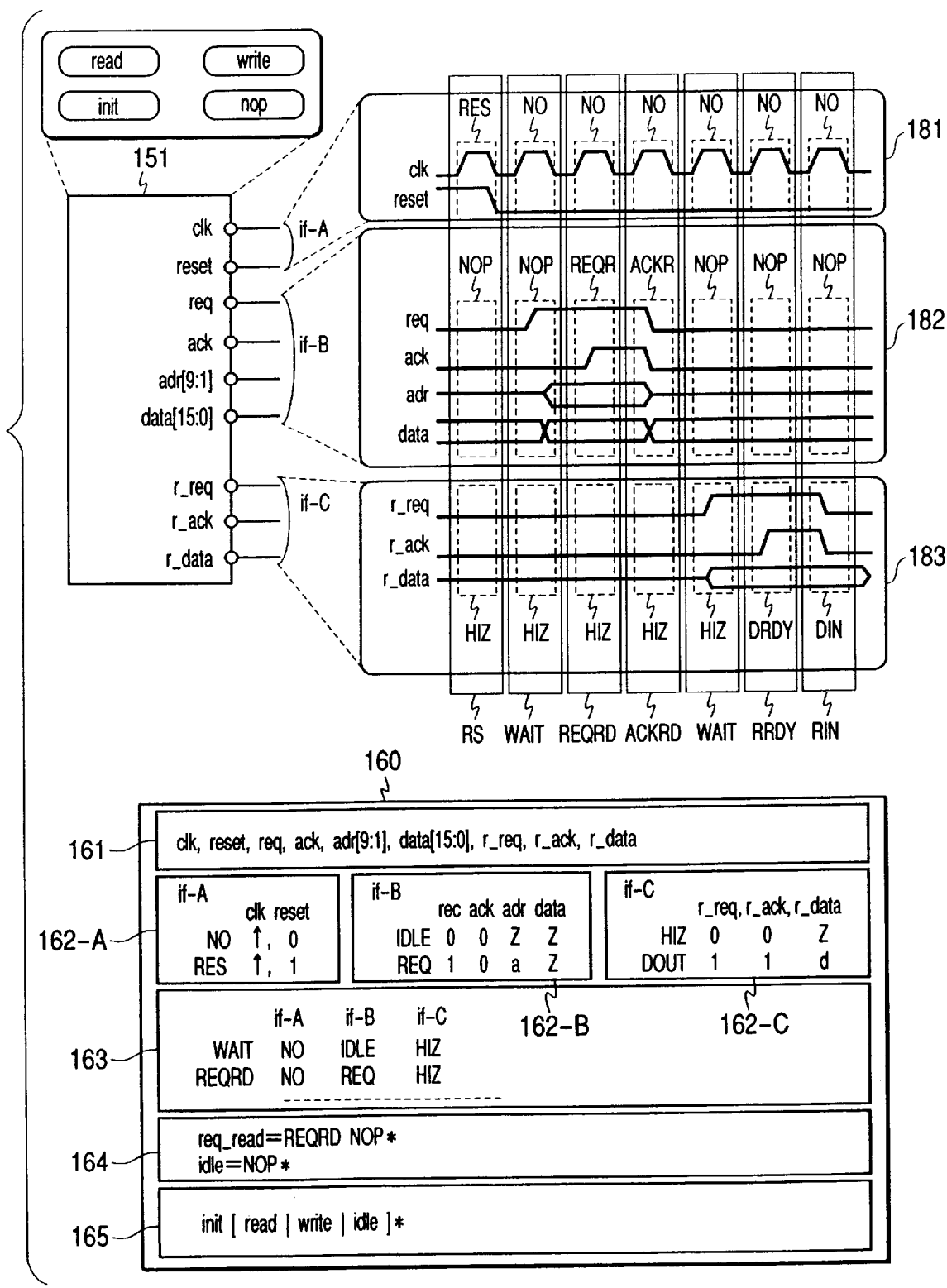
FIG. 4 is an explanatory diagram used for describing typical interface-definition-prescribing information implemented by the first embodiment.

FIG. 4 is an explanatory diagram used for describing typical interface-definition-prescribing information 160 shown in FIG. 1. As shown in FIG. 4, the logic circuit 151 has an interface having input/output-port sets if-A, if-B and if-C. At the ports of the port set if-A, electric waves 181 are generated repeatedly. By the same token, at the ports of the port set if-B, electric waves 182 are also generated repeatedly and, at the ports of the port set if-C, electric waves 183 are generated repeatedly as well. The interface-definition-prescribing information 160 is stored in a storage medium not shown in the figure.

Information stored in the storage medium includes information on combinations of signal values observed at specific times for the port set if-A of the logic circuit 151. In addition, the information stored in the storage medium also includes a piece of signal-value-definition-prescribing information 162-A for the port set if-A of the logic circuit 151. The signal-value-definition-prescribing information 162-A is an array of combinations of possible signal values in the operation of the logic circuit 151 for all ports of the port set if-A and identifiers each used for identifying one of the combinations. To put it concretely, consider clk and reset ports of the port set if-A as an example. In this case, a notation RES indicates that a reset signal appearing at the reset port is put in a high state on the rising edge of a clk signal appearing at the clk port. On the other hand, a notation NO indicates that the reset signal appearing at the reset port is put in a low state on the rising edge of the clk signal appearing at the clk port. Of course, the state of the reset signal on the falling edge of the clk signal can also be defined without causing a problem. In this example, however, only the state of the reset signal on the rising edge of the clk signal is defined. The notations RES and NO are each referred to as an identifier name. Much like the port set if-A, the port set if-B and the port set if-C are provided with respectively the signal-value-definition-prescribing information 162-B and the signal-value-definition-prescribing information 162-C, which are stored in the storage medium. It should be noted that, in actuality, the pieces of signal-value-definition-prescribing information 162-A, 162-B and 162-C do not have to be stored in the same file. As a matter of fact, the pieces of signal-value-definition-prescribing information 162-A, 162-B and 162-C do not have to be stored in the same storage medium.

The generalized-signal-value-definition-prescribing information 163 contains upper-level combinations each including aforementioned identifier names pertaining to different port sets. An identifier included in an upper-level combination represents values of signals possibly appearing at the same particular time as signal values represented by another identifier included in the upper-level combination. The upper-level combinations are each identified by an upper-level identifier name. On the other hand, the aforementioned identifier name representing a combination of signal values pertaining to a port set is referred to a low-level identifier name. An upper-level combination may include low-level identifier names pertaining to all or some port sets of a circuit module. In the example shown in FIG. 4, an upper-level identifier name WAIT represents the low-level identifier name NO representing a combination of signal values pertaining to the port set if-A, the low-level identifier name IDLE (or NOP) representing a combination of signal values pertaining to the port set if-B, and the low-level identifier name HIZ representing a combination of signal values pertaining to the port set if-C. The low-level identifier name NOP prescribed in the signal-value-definition-prescribing information 162-B represents a combination of signal values pertaining to an interface while the upper-level identifier name WAIT defined in the generalized-signal-value-definition-prescribing information 163 represents plural low-level identifier names or is an inter-interface identifier name. Thus, the generalized-signal-value-definition-prescribing information 163 defines upper-level identifier names each representing a function of the circuit module 151. A function represented by an upper-level identifier name is obtained by combining lower-level (subordinate) identifier names each representing ports pertaining to a port set. A lower-level identifier name included in an upper-level identifier name represents a port set different from another port set represented by another lower-level identifier name included in the same upper-level identifier name. An upper-level identifier name is thus the logic circuit's interface information showing a function of the logic circuit or a portion of a function of the logic circuit 151.

Figure 5:
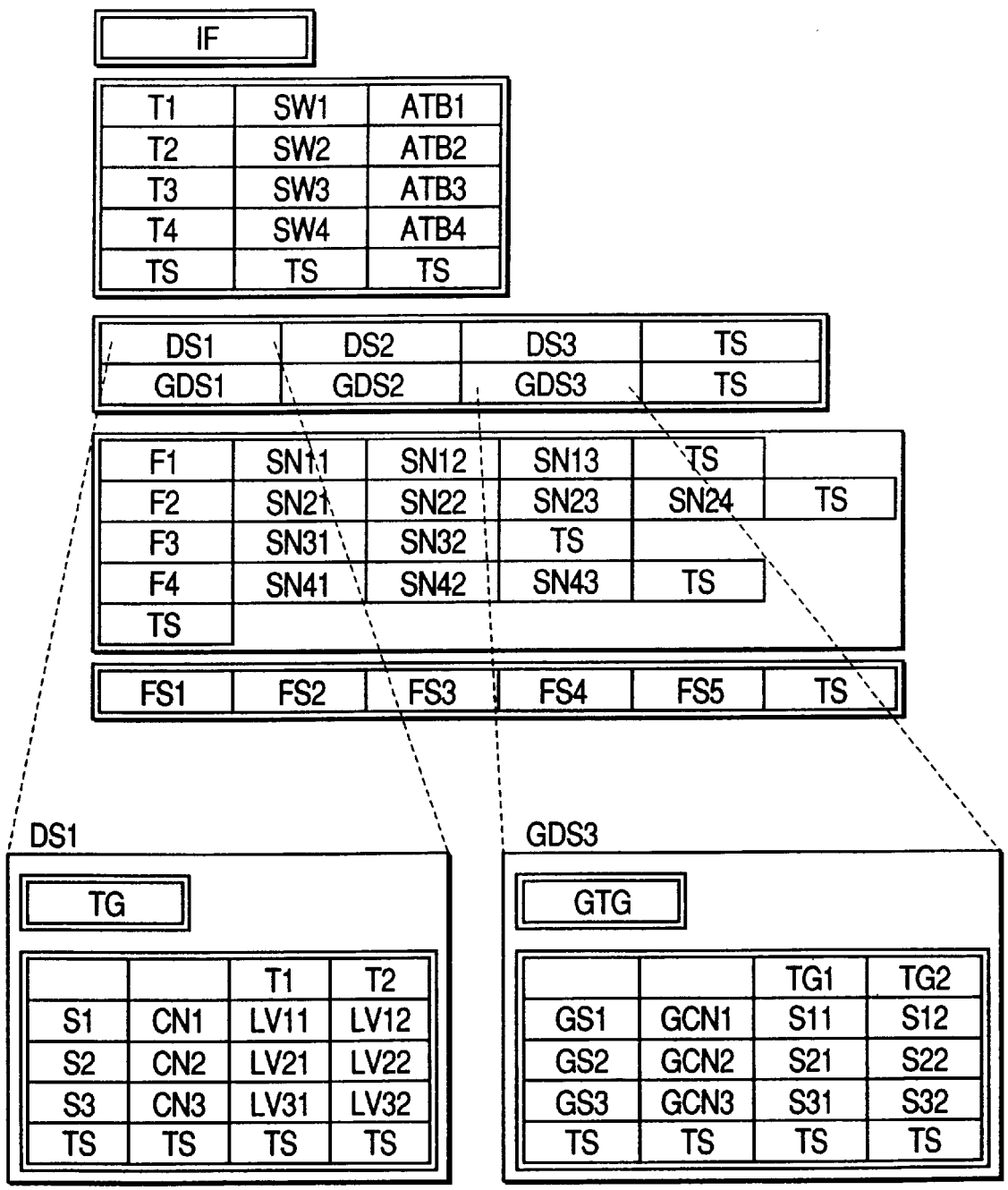
FIG. 5 is diagram showing a data structure in a storage medium used for storing the interface-definition-prescribing information in accordance with the first embodiment.

FIG. 5 is diagram showing a data structure in the storage medium used for storing the interface-definition-prescribing information 160 explained above by referring to FIGS. 1 and 4. First of all, a name IF assigned to an interface for all ports of the logic circuit is stored in the storage medium. The name IF is followed by information on ports covered by the interface. The information on ports corresponds to the port-definition-prescribing information 161 shown in FIG. 1. For each port, the information includes a port name such as T1, the width of the port such as SW1 or the number of signals input or output through the port and a signal attribute such as ATB1 indicating whether the signals are input or output signals. In this embodiment, there are 4 ports T1 to T4. An end symbol TS is put at the end of the information to indicate that there is no more port.

Figure 3:
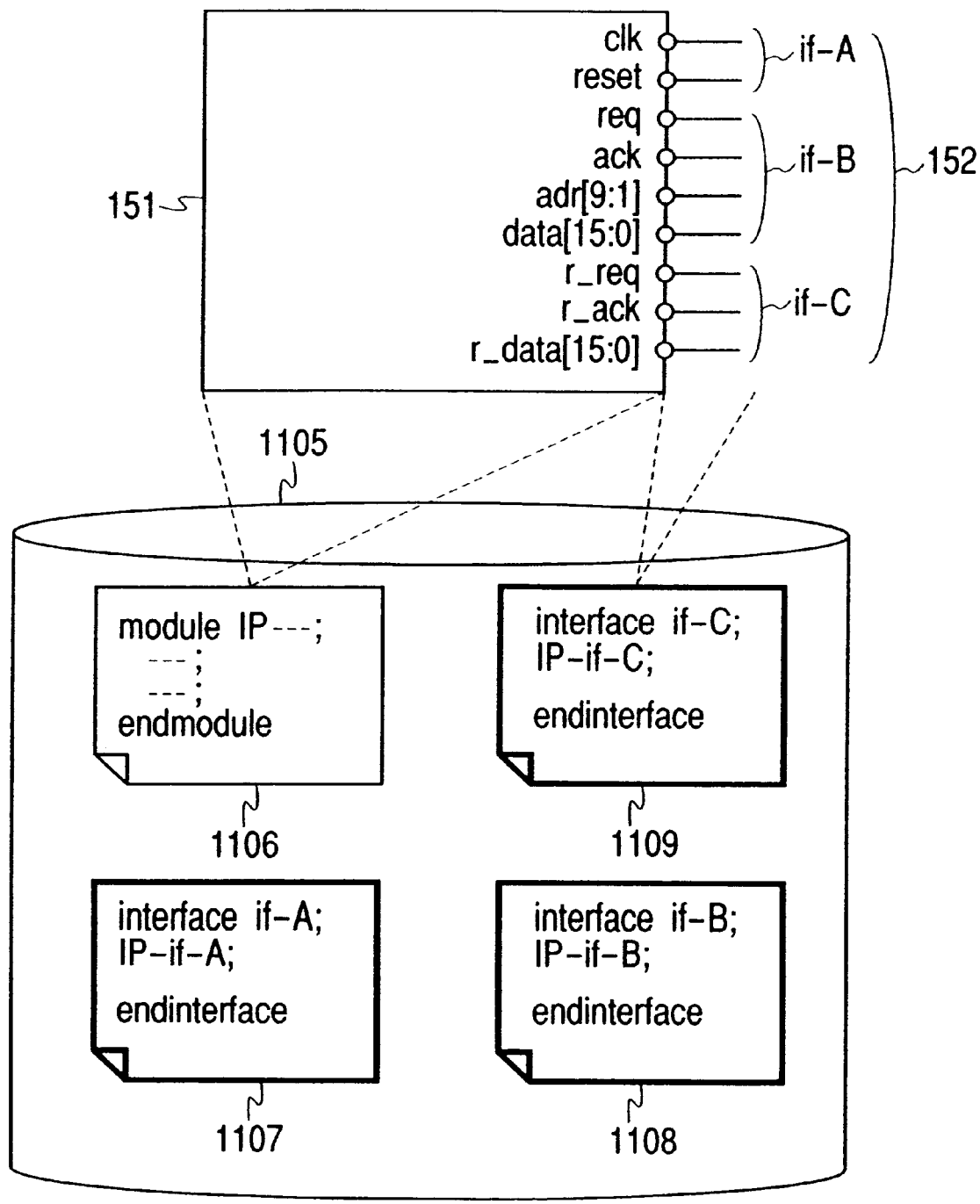
FIG. 3 is a diagram showing the conventional technique of defining interfaces.

The information on ports is followed by data corresponding to pieces of signal-value-definition-prescribing information denoted by reference numerals 162-A, 162-B and 162-C in FIG. 1 and generalized-signal-value-definition-prescribing information denoted by reference numeral 163 in the same figure. The signal-value-definition-prescribing information is described for each port set or each interface accommodating some of the ports described in the information on ports. In the example shown in FIG. 5. notations DS1 to DS3 each denote signal-value-definition-prescribing information 162 described for one of port sets corresponding to port sets if-A to if-C shown in FIG. 1. A diagram on the left side at the bottom of FIG. 3 shows the structure of signal-value-definition-prescribing information 162 described for a port set. In this example, the diagram on the left side at the bottom of FIG. 3 shows the structure of signal-value-definition-prescribing information DS1. Assume that the signal-value-definition-prescribing information DS1 is described for the port set if-A shown in FIG. 1. In this case, notation TG corresponds to the port set if-A. Notations T1 and T2 each denote a port. The ports T1 and T2 thus correspond to respectively the clk and reset ports shown in FIG. 1. Notations S1 to S3 each denote a combination of signal values LV11 and LV12 of the ports T1 and T2 respectively. Thus, S1 and S2 are subordinate identifier names corresponding to respectively NO and RES in the signal-value-definition-prescribing information 162-A shown in FIG. 1. The signal value LV11 corresponds to a rising edge (↑) of a signal appearing at the port T1 whereas the signal value LV12 corresponds to a low level (or a Boolean value of 0) of a signal appearing at the port T2. The signal values LV21 and LV22 correspond typically to a falling edge (↓) and a high level (or a Boolean value of 1) respectively. In addition to 0 and 1, a Boolean value can be an indeterminate value It should be noted that notations CN1 to CN3 each denote an abbreviation of an identifier name The symbol TS used in the structure of signal-value-definition-prescribing information DS1 also indicates the end of data.

In the example shown in FIG. 5, notations GDS1 to GDS3 each denote generalized-signal-value-definition-prescribing information. As an example, the generalized-signal-value-definition-prescribing information GDS3 on the right side at the bottom of FIG. 5 is described in detail as follows. A notation GTG represents the name of an upper-level group having plural port sets. In the case of the generalized-signal-value-definition-prescribing information GDS3, the upper-level group has port sets TG1 and TG2, which typically correspond to any two of the port sets if-A, if-B and if-C of the logic circuit shown in FIG. 4. The port set TG1 where i=1 or 2 is a port set denoted by the symbol TG in the signal-value-definition-prescribing information DS1 on the left side. A symbol GS1 is an upper-level identifier name typically corresponds to WAIT in the generalized-signal-value-definition-prescribing information 163 shown in FIG. 4. The upper-level identifier name GS1 represents subordinate identifier names S11 and S12 If the port set TG1 corresponds to the port set TG of the signal-value-definition-prescribing information DS1 on the left sides for example, the subordinate identifier names S11 and S12 typically correspond to respectively the subordinate identifier names S1 and S2 on the left side. By the same token, an upper-level identifier name GS2 represents subordinate identifier names S21 and S22 whereas an upper-level identifier name GS3 represents subordinate identifier names S31 and S32. Thus, the generalized-signal-value-definition-prescribing information GDS3 includes a definition of each upper-level identifier name which is also referred to as an inter-interface identifier name of a generalized-identifier name. It should be noted that, while FIG. 1 shows only a piece of the generalized-signal-value-definition-prescribing information 163 covering the port sets if-A to if-C, the embodiment shown in FIG. 5 includes 3 pieces of the generalized-signal-value-definition-prescribing information, namely, GDS1 to GDS3, which can be represented by a notation if-all.

As shown in FIG. 5, the information stored in the storage medium includes function definitions named F1 to F4. For example, the function definition name F1 is associated with plural signal series named SN11 to SN13. The name SNij is the upper-level name GSi defined in the generalized-signal-value-definition-prescribing information GDSi or the abbreviation CGNi of the upper-level name GSi. Thus, the function-definition name Fi is a top-level identifier name representing plural upper-level names SNij. If the number of times a combination of signals appear or the order in which combinations of signals appear is cannot be determined uniquely, a repetition or an existence/nonexistence indicator of a specific signal-value definition name is used. As an alternative, a symbol indicating selection of plural signal series is used. For example, traditionally, a notation of "(A B) *" indicates that "A B" be generated plural times and a notation of "[A B|C D]" indicates that either "A B" or "C D" be generated. Since this data has a variable length, the termination symbol needs to be placed at the end of the data.

The generalized-function-definition-prescribing information is an array of identifier names defined in signal-value definitions DS1 to DS3 as well as upper-level identifier names defined in generalized-signal-value-definitions GDS1 to GDS3, and function definition names F1 to F4, which are arranged in an order combinations of signal values are generated.

From the structure of data stored in the storage medium as shown in FIG. 5, it is possible to generate any series of signals that may probably appear at a port of a logic circuit serving as an object of definition by carrying out computer processing. A series of signals generated from this data structure is exactly the same as a traditionally known definition of a combination of signal values for each port. By grouping ports into plural sets and storing signal-value-definition-prescribing information for each of the port sets, the number of signal-value combinations to be defined can be reduced. Assume for example that the number of ports is 10 and the number of Boolean-value types for each of the ports is 4. In this case, the number of combinations to be defined is the $10^{th}$ power of 4. By grouping the 10 ports into 2 sets each having 5 ports, however, it is necessary to define only (the $5^{th}$ power of 4)+(the $5^{th}$ power of 4) combinations in order to express the same interface.

Figure 6:
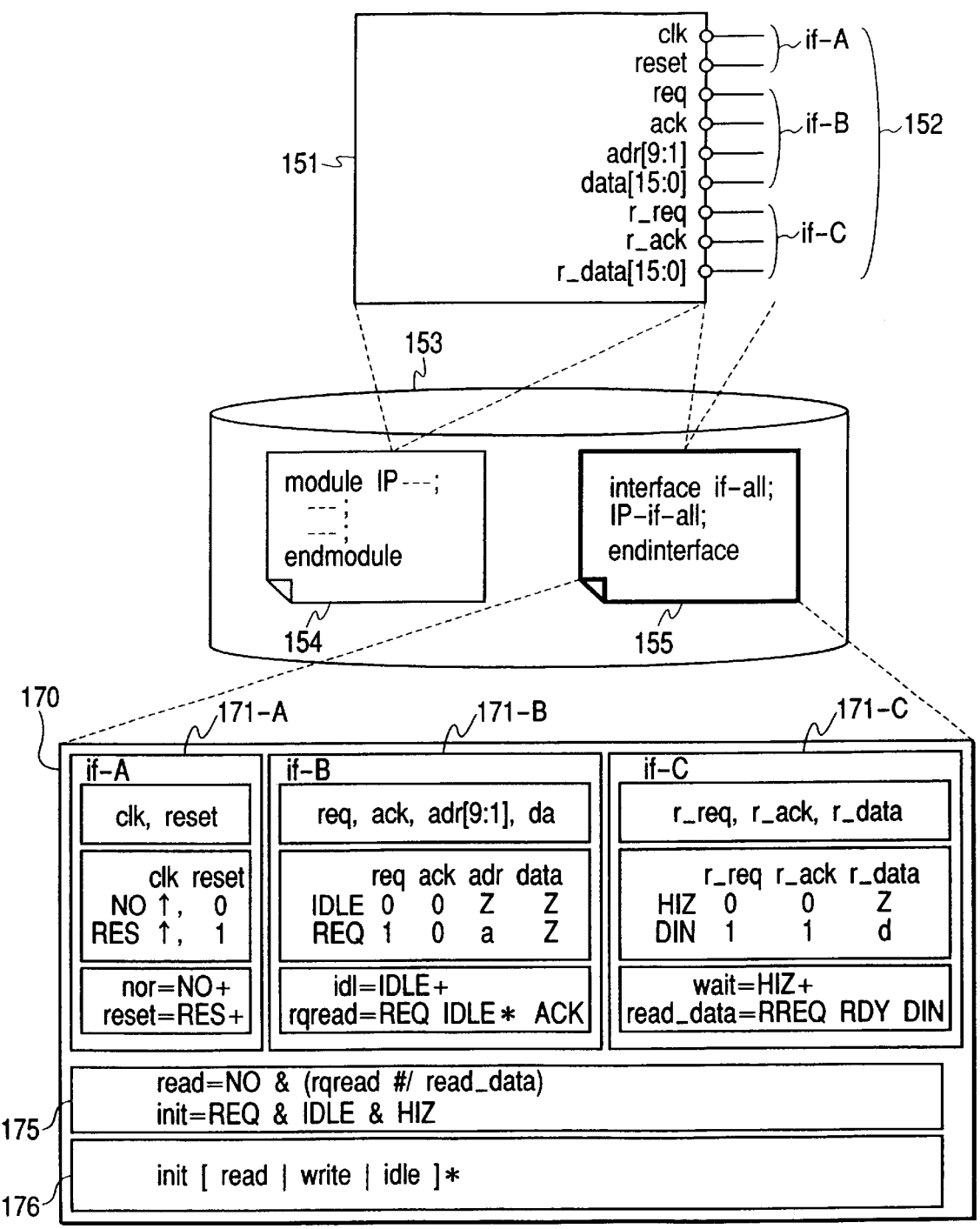
FIG. 6 is an explanatory diagram showing a second embodiment of the present invention.

FIG. 6 is a diagram showing a second embodiment of the present invention. As shown in FIG. 6, a logic circuit 151 has input/output signals 152. Much like the embodiment shown in FIG. 1, input/output ports are grouped into a port set if-A serving as an interface A, a port set if-B serving as an interface B and a port set if-C serving as an interface C. As is the case with the embodiment shown in FIG. 1, however, the grouping of input/output ports is typical to the bitter end. Traditionally, interface information of a logic circuit having plural interfaces is defined and stored individually for each of the interfaces by adopting a method shown in FIG. 3. On the other hand, the second embodiment shown in FIG. 6 is characterized in that interface information defined individually for each of the interfaces is stored along with related-function-definition-prescribing information 175 prescribing definitions of relations between pieces of function information of different interfaces.

Figure 7:
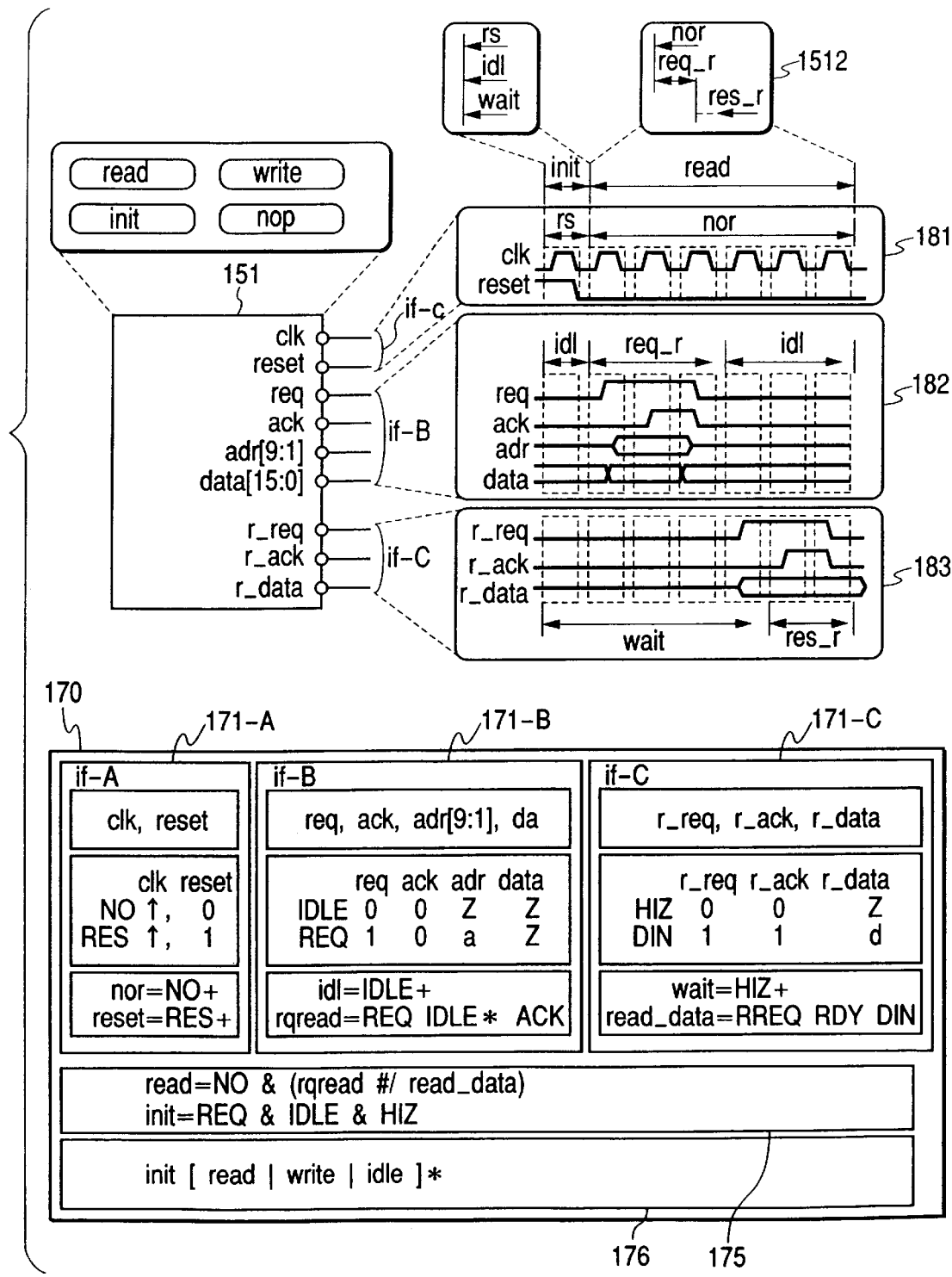
FIG. 7 is an explanatory diagram used for describing interface-definition-prescribing information implemented by the second embodiment.

FIG. 7 is an explanatory diagram used for describing interface-definition-prescribing information shown in FIG. 6. As shown in FIG. 7, the logic circuit 151 has input/output port sets if-A, if-B and if-C. Assume that reference numerals 181, 182 and 183 denote waves, which may be generated repeatedly at the input/output port sets if-A, if-B and if-C respectively. The interface-definition-prescribing information 170 of the logic circuit 151 is stored in a storage medium 153. First of all, interface-definition-prescribing information 171-A for the port set if-A of the logic circuit 151 is stored in the storage medium 153.

The interface-definition-prescribing information 171-A includes port-definition-prescribing information 172 defining ports pertaining to the port set if-A. Signal-value-definition-prescribing information 173 includes an array of ports pertaining to the port set if-A, and combinations of signal values that may be observed at the ports. In the case of the port set if-A, the ports are named clk and reset whereas the combinations are named NO and RES which each define a combination of signal values in the same way as the information shown in FIG. 4. The interface-definition-prescribing information 171-A also includes function-definition prescribing information 174. Examples of function definitions prescribed in the function-definition-prescribing information 174 are "nor" and "rs". The function definitions are each associated with an array of combination identifiers such as NO and RES defined in the signal-value-definition-prescribing information 173. In the function-definition-prescribing information 174, the combination identifiers NO and RES are arranged in the array in an order the combination identifiers NO and RES appear at the ports pertaining to the port set if-A during the operation of the logic circuit 151. Also in the case of the second embodiment, identifiers such as NO and RES defined in the signal-value-definition-prescribing information 173 are different from identifiers such as "nor" and "rs" defined in the function-definition-prescribing information 174. Typically, identifiers defined in the signal-value-definition-prescribing information 173 are lower-level identifiers or subordinate identifiers while identifiers defined in the function-definition-prescribing information 174 are upper-level identifiers. The port-definition-prescribing information 172, the signal-value-definition-prescribing information 173 and the function-definition-prescribing information 174 are provided for each of the port sets if-B and if-C as the interface-definition-prescribing information 171-B and the interface-definition-prescribing information 171-C respectively in the same way as the port set if-A described above. It should be noted that the interface-definition-prescribing information 171-A, the interface-definition-prescribing information 171-B and the interface-definition-prescribing information 171-C can be accommodated in the same file or different files stored in the same storage medium or different storage media.

In addition, the interface-definition-prescribing information 170 includes related-function-definition-prescribing information 175 defining combinations each having upper-level identifier names defined in the function-definition-prescribing information 174. Lower-level identifier names and upper-level identifier names put in a combination in the related-function-definition-prescribing information 175 may pertain to different port sets. An example of a combination is named "read" which has "nor" representing a series of signals appearing at the port set if-A, a series of signals "req_r" generated at the port set if-B at the start of "nor" and a series of signals "res_r" generated at the port set if-C at the end of "req_q" in a sequence denoted by reference numeral 1512 in FIG. 7. Thus, a combination in the related-function-definition-prescribing information 175 can be regarded as a top-level identifier. How these signal series such as "nor", req_r" and "res_r" appear along the time axis can be defined by using sequence-definition-prescribing information indicating a simultaneous start of signal series, a start of a signal series after the beginning of another signal series, a start of a signal series at the end of a preceding signal series and a start of a signal series after the end of a preceding signal series which can be described for different purposes.

Figure 8:
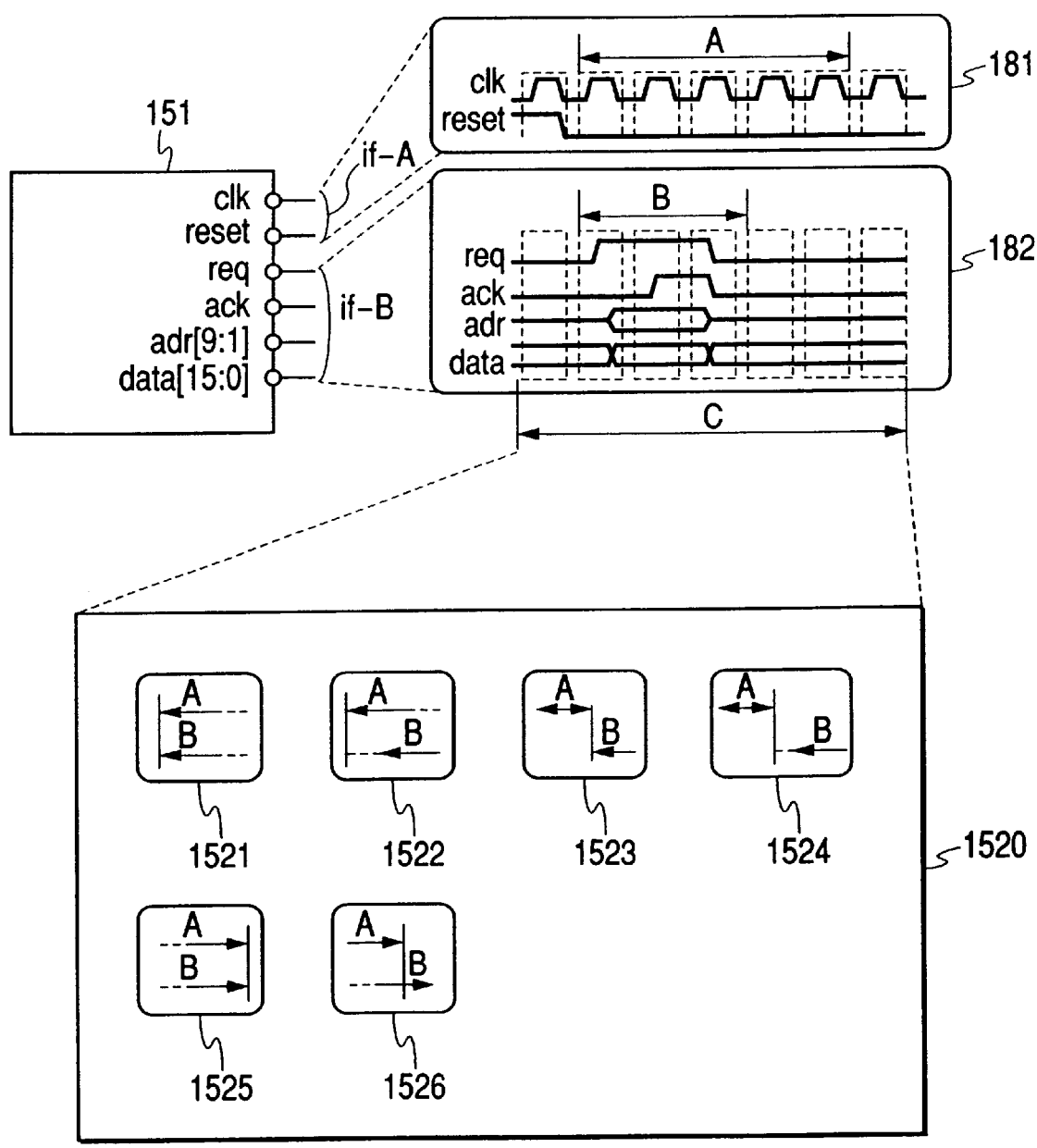
FIG. 8 is an explanatory diagram showing sequential relations of the interfaces described in the interface-definition-prescribing information shown in FIG. 7.

FIG. 8 is an explanatory diagram showing sequential relations of the interfaces described by referring to FIG. 7. In the example shown in FIG. 8, ports of the logic circuit 151 are grouped into port sets if-A and if-B. A signal-series function C is a combination of A and B where A is a combination of signal values observed at the port set if-A and B is a combination of signal values observed at the port set if-B. The sequential relation between the functions A and B can be a relation indicated by a symbol denoted by one of reference numerals 1521 to 1526 or there may be no correlation between A and B. In this embodiment, a sequential relation, if any, is stored as information. Reference numeral 1521 denotes a symbol representing a sequential relation wherein the functions A and B start at the same time. Reference numeral 1522 denotes a symbol representing a sequential relation wherein the function B starts after the beginning of the function A. Reference numeral 1523 denotes a symbol representing a sequential relation wherein the function B starts at the end of the function A. Reference numeral 1524 denotes a symbol representing a sequential relation wherein the function B terminates after the end of the function A. Reference numeral 1525 denotes a symbol representing a sequential relation wherein the functions A and B end at the same time. Reference numeral 1526 denotes a symbol representing a sequential relation wherein the function B completes after the end of the function A.

Assume that the function C is defined as a combined function wherein the function B always starts after the beginning of the function A, and the functions A and B always end at the same time. In this case, the function is defined as a symbol 1522 representing a sequential relation wherein the function B starts after the beginning of the function A and a symbol 1525 representing a sequential relation wherein the functions A and B end at the same time. It should be noted that sequential relations between the functions A and B are not limited to those described above.

Figure 9:
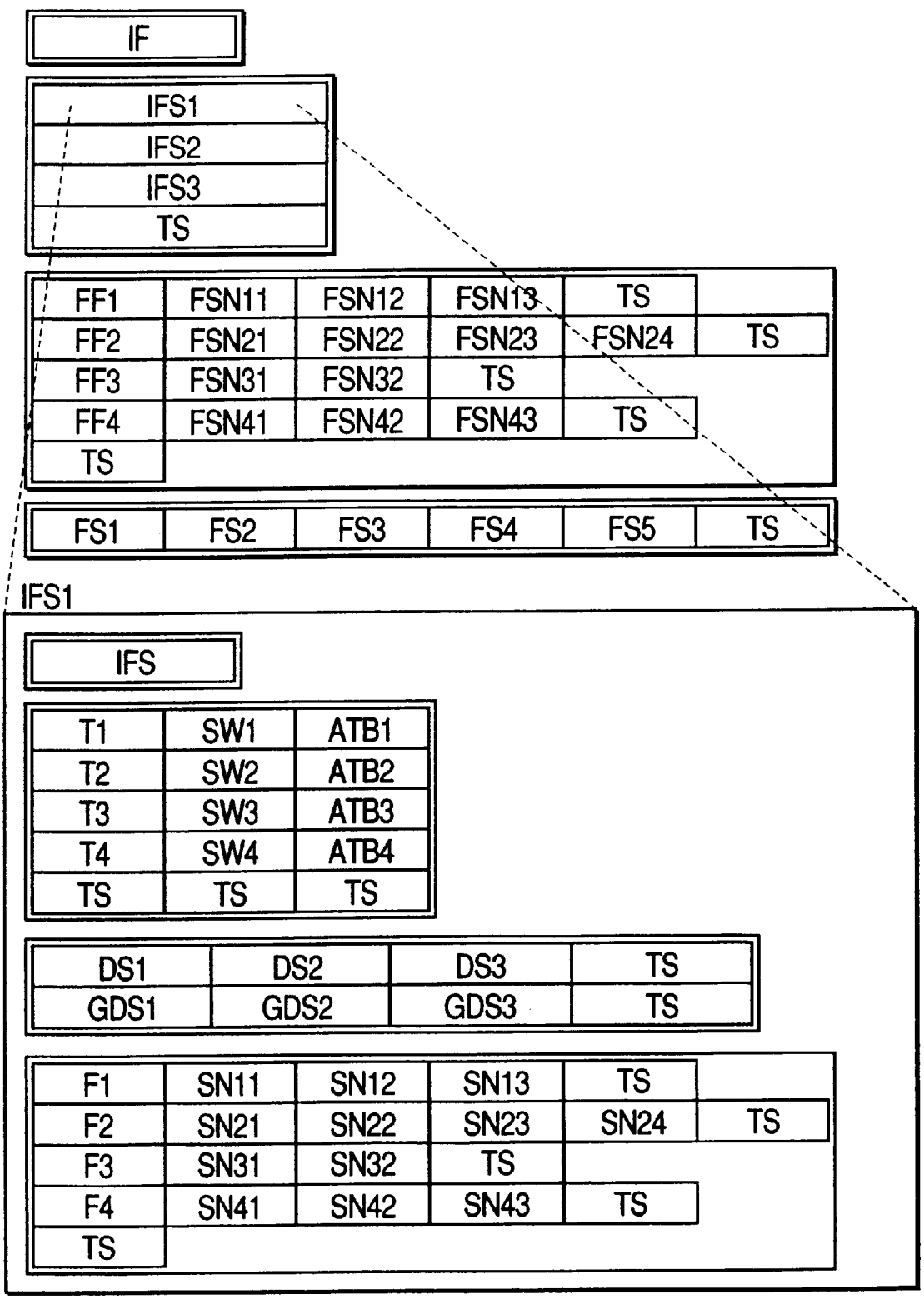
FIG. 9 is diagram showing a data structure in a storage medium used for storing the interface-definition-prescribing information in accordance with the second embodiment.

FIG. 9 is an explanatory diagram showing the data structure of the interface-definition-prescribing information 170 stored in the storage medium readable by a computer and explained earlier by referring to FIGS. 6 and 7. A symbol IF denotes the name of an interface to be described below. Symbols IFS1 to IFS3 each denote interface-definition-prescribing information defining an interface for a port set. Thus, the interface-definition-prescribing information IFS can be regarded as a definition of a sub-interface for a port set. Each interface-definition-prescribing information IFS includes signal widths SW1 to SW4 and attributes ATB1 to ATB4 for respectively ports T1 to T4 pertaining a port set associated with the interface-definition-prescribing information IFS. Each interface-definition-prescribing information IFS also includes pieces of signal-value-definition-prescribing information DS1 to DS3, pieces of generalized-signal-value-definition-prescribing information GDS1 to GDS3, and pieces of function-definition-prescribing information F1 to F4 each defined as a combination of signals SNij. Thus, the information defined for a sub-interface can be considered to be the same as the information shown in FIG. 5 except the sub-interface information excludes the pieces of generalized-function-definition-prescribing information FS1 to FS5.

The interface information IF also includes pieces of related-function-definition-prescribing information FF1 to FF4. which are a characteristic of this embodiment. The related-function-definition-prescribing information FF1 includes symbols FSN11 to FSN13. The other pieces of related-function-definition-prescribing information FF2 to FF4 each include symbols FSNij in the same way as FF1 where i=2 to 4 and j=1 to 3. The symbol FSNij represents the function-definition-prescribing information Fk where k=1 to 4 defined in the sub-interface-defining information or its abbreviation, an array of sequential-relation-defining symbols and a termination symbol. Examples of the symbol for defining a sequential relation are described as follows.

1: "#"

A signal defined by a function-defining name immediately following the "#" symbol is generated at a processing time after complete generation of all signals represented by function-defining names preceding the "#" symbol.

2: "#/"

A signal defined by a function-defining name immediately following the "#/" symbol is generated at any time following a processing time after complete generation of all signals represented by function-defining names preceding the "#/" symbol.

3: "&"

A signal defined by a function-defining name immediately following the "&" symbol is generated at the same time as generation of all signals represented by function-defining names preceding the "&" symbol.

4: "&/"

A signal defined by a function-defining name immediately following the "&/" symbol is generated at the same time as or at any time after generation of all signals represented by function-defining names preceding the "&/" symbol.

In a process of combining identifiers of all port sets, the identifiers can be combined into one set or plural sets.

Finally, the interface information IF also includes pieces of generalized-information-definition-prescribing information FS1 to FS5, which are arranged in an order combinations of signal values related to identifiers are generated.

Figure 10:
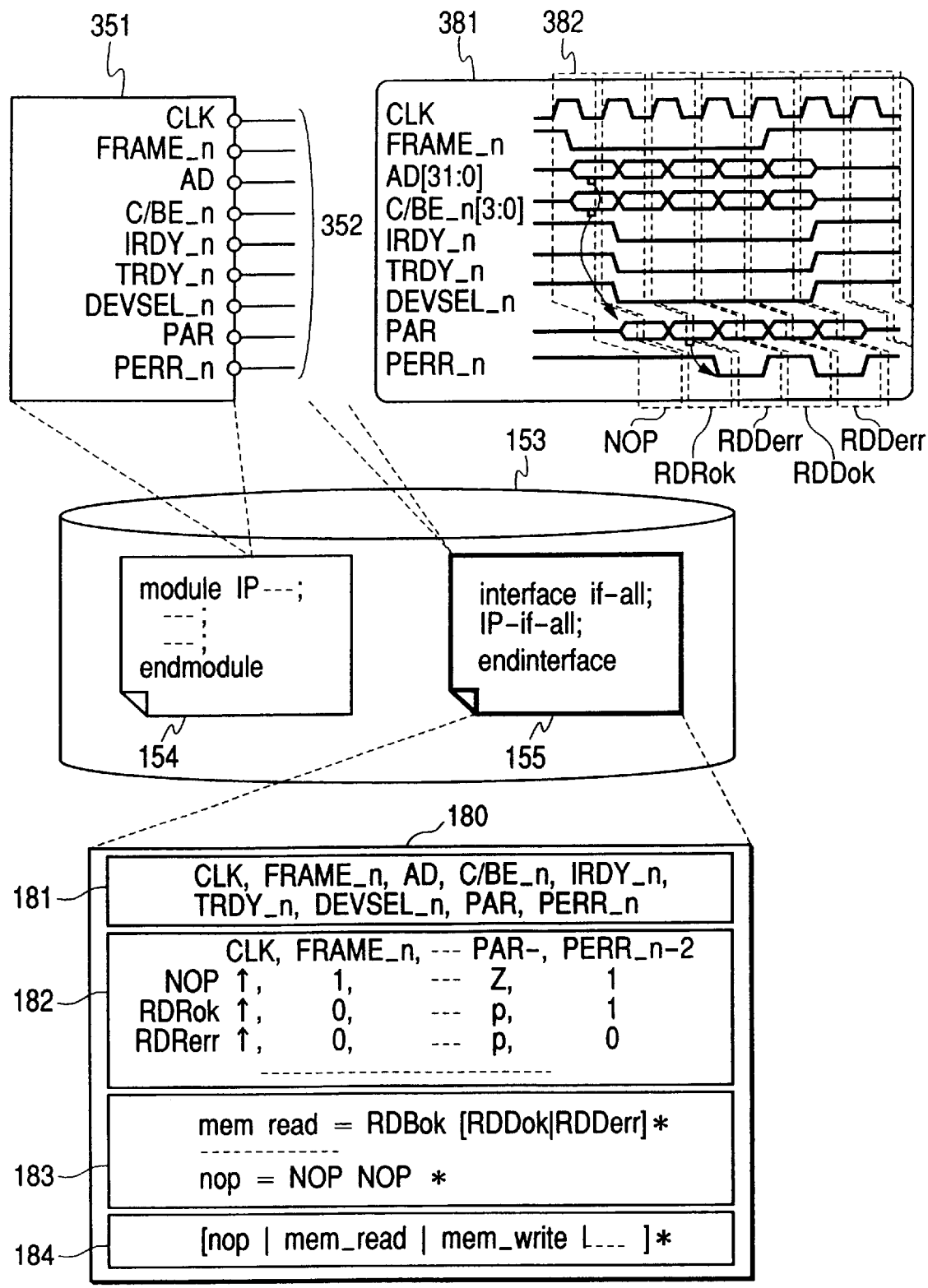
FIG. 10 is an explanatory diagram showing a third embodiment of the present invention.

FIG. 10 is a diagram showing a third embodiment of the present invention. As shown in the figure, a logic circuit 351 has input/output signals 352. The logic circuit 351 is a typical logic circuit operating in accordance with a PCI bus protocol. A waveform diagram 381 shows a memory read operation of the logic circuit 351. In accordance with the present invention, a combination of past, present and future values of signals appearing at specified ports can be defined by assigning an identifier name to the defined combination. For example, an identifier name of NOP is assigned to a combination 382. By using the same concept as the combination 382, other combinations named RDRok, RDDerr and so on can also be defined. In the waveform diagram 381 of FIG. 10, a future value of a signal appearing at a PAR port and lagging behind the present value of a signal appearing at a CLK port by 1 clock cycle is combined with the values of signals appearing the CLK and other ports. On the other hand, a future value of a signal appearing at a PERR_n port and lagging behind the present value of a signal appearing at the CLK port by 2 clock cycles is combined with the values of signals appearing the CLK and other ports.

FIG. 11 is an explanatory diagram showing the data structure of interface-definition-prescribing information 155 stored in a storage medium readable by a computer and explained by referring to FIG. 10. A symbol IF denotes the name of an interface to be described below. Symbols T1 to T4 each denote a port of the logic circuit. The ports T1 and T4 are associated with signal widths SW1 to SW4 and attributes ATB1 to ATB4 respectively. Symbol S1 and S2 each denote a combination of Boolean values of signals appearing at the ports T1 to T4. The concept of the combinations is the same as that of the signal-value combinations DS1 to DS3 shown in FIG. 5 In the case of this embodiment, however, each combination includes times TM1, TM2 and TM3 in addition to the Boolean values of signals appearing at the ports T1 to T4. The times TM1 to TM3 are times at which the values of the signals are observed at the ports T1 to T3 respectively. The values of the times TM1 to TM3 can be positive or negative. A positive time value indicates a time in the future while a negative time value indicates a time in the past. It should be noted that the different times TM1 to TM3 assigned to the ports T1 and T3 are typical. For example, the same time may also be assigned to all the ports T1 to T3.

Symbols F1 to F3 each denote function-definition-prescribing information. This information is the same as the information F1 to F5 shown in FIG. 5. Finally, symbols FS1 to FS5 each denote generalized-function-definition-prescribing information. It should be noted that, while ports of the logic circuit are not grouped in this embodiment, the concept of this embodiment can also be applied to a case in which ports of the logic circuit are grouped into plural port sets as is the case with the first embodiment.

Figure 12:
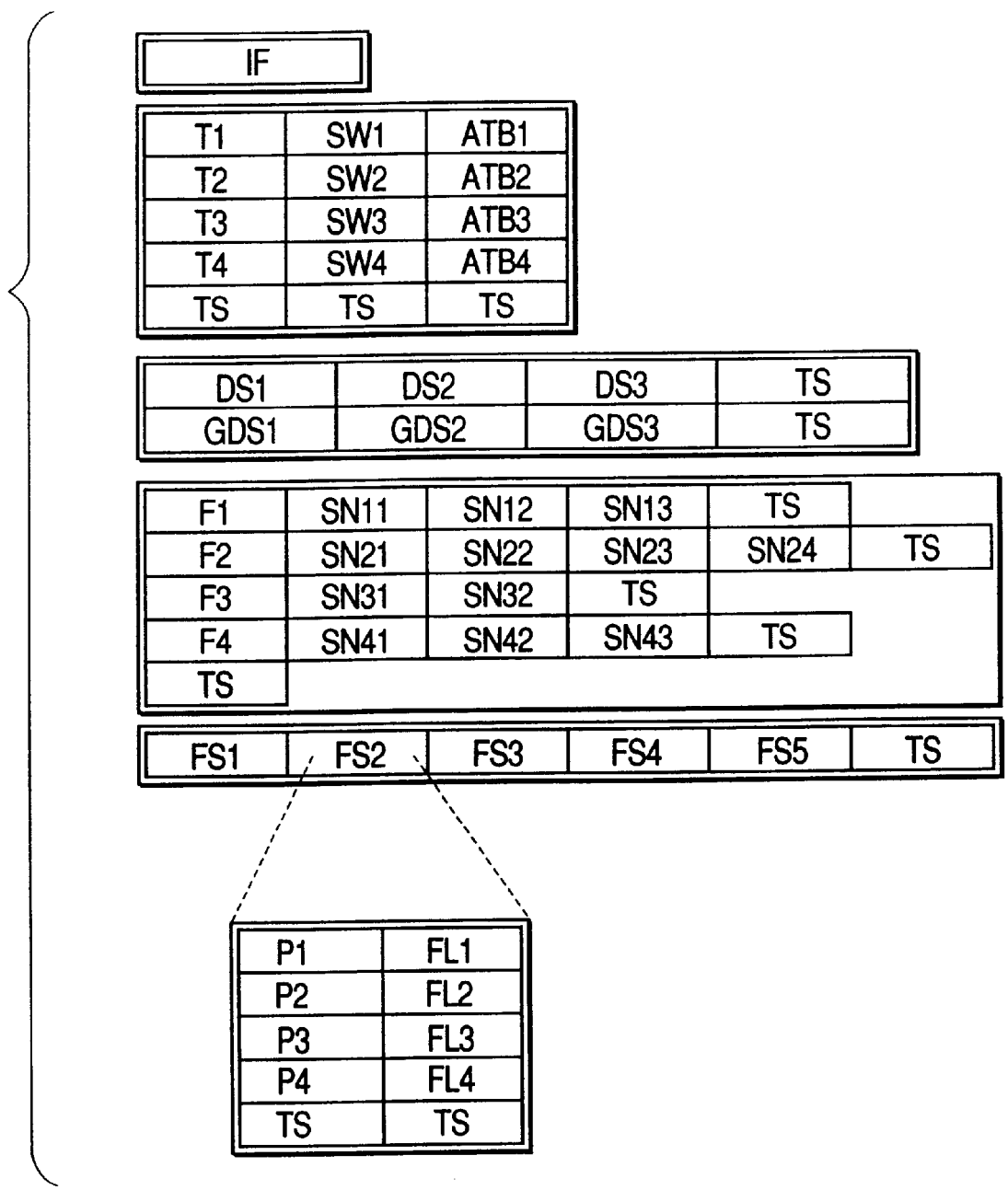
FIG. 12 is a diagram showing a fourth embodiment of the present invention.

FIG. 12 is a diagram showing a fourth embodiment of the present invention. FIG. 12 shows interface descriptions similar to the first embodiment shown in FIG. 5. A difference between the fourth and first embodiments is that, in the case of the fourth embodiment, each of the function definitions F1 to F4 includes a function attribute. By the same token, each of the generalized-function definitions FS1 to FS5 also includes a function attribute.

A first function attribute P1 of a generalized function definition is a flag FL1 representing the function at a level presented to the user or part of a function at the level directly unusable by the user. With this flag, it is possible to conceal a function that the user is not capable of using directly when an operation waveform is presented to the user or a table of functions that can be specified by the user is presented in a logic simulation.

A second function attribute P2 of the generalized function definition is a flag FL2 indicating whether the function for a certain port set or a relation among plural port sets is defined. This flag allows the user to visually recognize whether a function for a certain port set or a relation among plural port sets is defined. In addition, positions of symbols each representing a sequential relation between functions can be limited. Moreover, for a function defined by using a sequential relation, a relation with another function can be defined. It is quite within the bounds of possibility that a sequential relation still has ambiguity or a contradiction. By limiting the number of times an order is set by using this flag, however, ambiguity and a contradiction can be avoided.

A third function attribute P3 of the generalized function definition is a flag FL3 indicating whether or not generation of an interrupt during execution of the function is disabled. In definition of a sequence of interrupts assumed to be generatable at any arbitrary locations, this flag allows visual recognition of disabled generation of an interrupt during execution of the function. In addition, a computer is also capable of determining whether or not generation of an interrupt during execution of the function is disabled by reading out the value of this flag.

A fourth function attribute P4 of the generalized function definition is a flag FL4 indicating whether or not an operation of the function is to be restarted by returning from any arbitrary point in the middle of the operation to the beginning of the function. This flag allows a selection to restart an operation from the beginning of the function in the event of discontinuation of an operation due to a software reset or a hardware reset of the logic circuit. In addition, the flag can also be used for expressing a type of operation that needs to be restarted from the beginning of the function in case a general interrupt has occurred in the logic circuit.

The embodiment explained above can be implemented by combining the embodiment with the other embodiments. Of course, the embodiment can also be implemented in an embodiment obtained as a result of combination of the other embodiments with each other.

Figure 13:
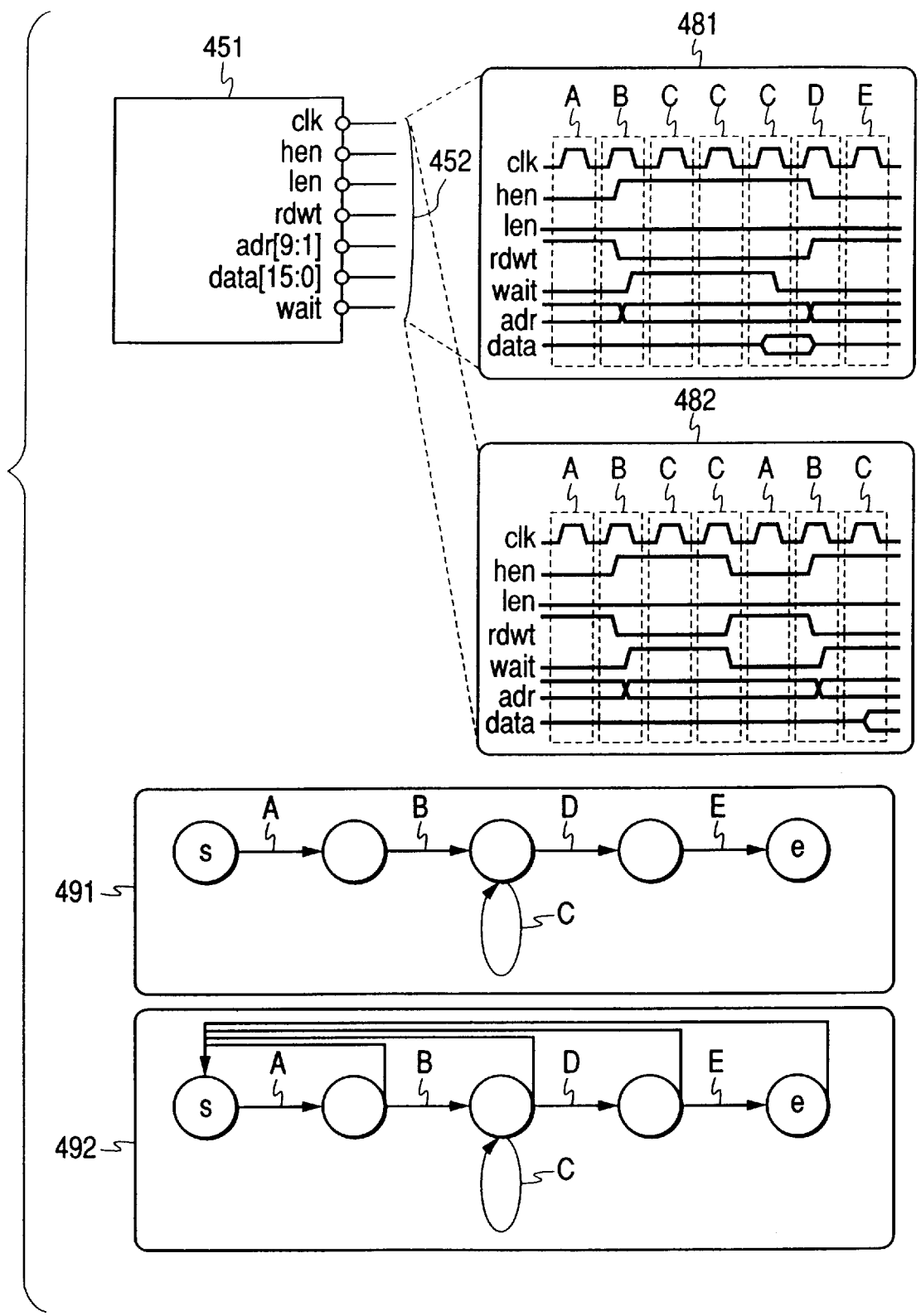
FIG. 13 is an explanatory diagram used for explaining a fourth function attribute provided by the fourth embodiment.

FIG. 13 is an explanatory diagram used for explaining the fourth function attribute P4 shown in FIG. 12.

As shown in FIG. 13, a logic circuit 451 has ports 452. When the power supply is turned on, the ports 452 display a behavior 481. The behavior 481 can be expressed as state transitions 491 through paths from a start state s of a state machine to an end state e thereof. A combination of values of signals appearing during each state transition is denoted by a symbol such as A, B or the like. For the values of signals denoted by a symbol, refer to the behavior 481. In the waveform diagram of the behavior 481, values of the signals vary with the lapse of time, forming combinations represented symbols A, B, C, C, C, D and E. In a normal operation, the state transitions 491 take place. In the event of an unexpected accident such as a hardware reset or a communication interruption which occurs during the operation of the logic circuit, however, a function may be restarted from its initial state depending on the type of the function. An example of the restart is exemplified by a behavior 482. At the end of the signal-value combinations A, B, C and C in the behavior 482, the operation is returned to the start state s as shown in the state transitions 492 to start the function from the combination A. The return to the start state is made possible by a state machine with the state transitions 492. By adding by the fourth function attribute P4 shown in FIG. 11, the state machine with the state transitions 491 can be handled in a pseudo manner in the same way as the state machine with the state transitions 492 is.

Figure 14:
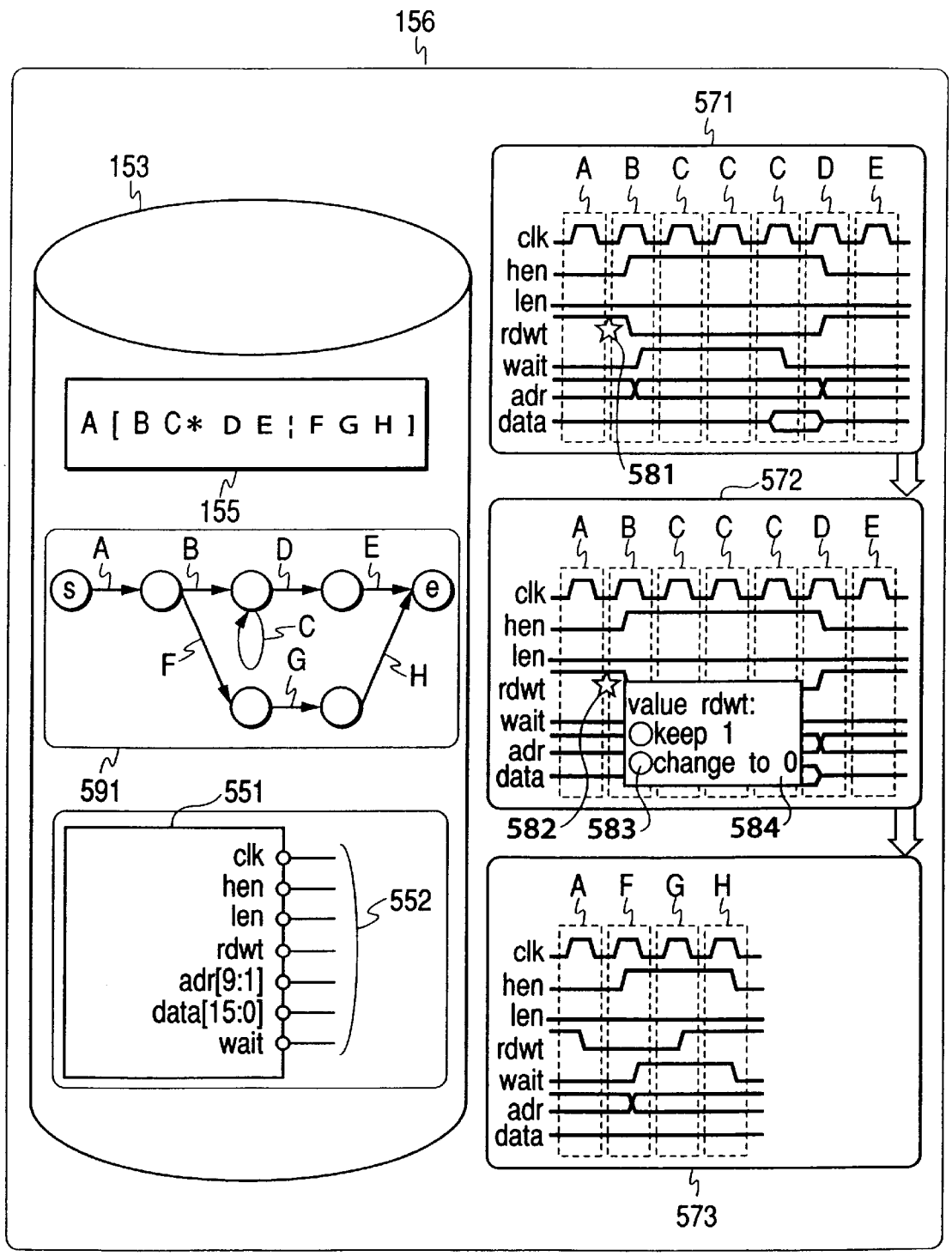
FIG. 14 is a diagram showing the configuration of an interactive waveform display system provided by the present invention.
Figure 15:
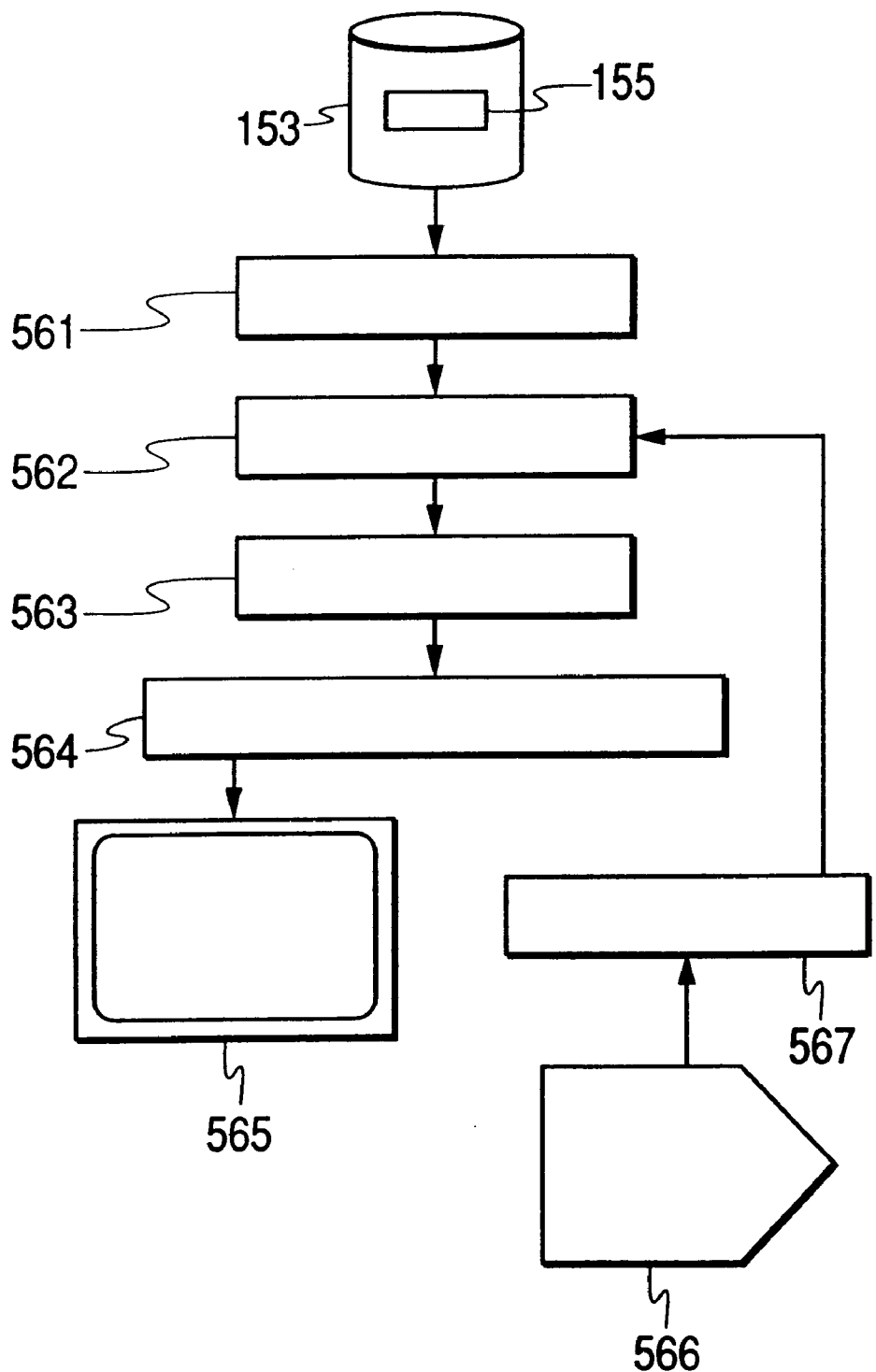
FIG. 15 is a diagram showing the operation of the interactive waveform display system.

FIGS. 14 and 15 are diagrams showing an embodiment using interface-definition-prescribing information. The embodiment implements a waveform display system for interactively displaying operation waveforms of a logic circuit 551. Even though the logic circuit 551 is the one shown in FIG. 13, the embodiment is applicable to the logic circuits of the other embodiments without causing a problem. As shown in FIG. 14, the logic circuit 551 has ports 552. A storage medium 153 is used for storing interface-definition-prescribing information 155.

First of all, an interface-state-generating means 561 shown in FIG. 15 builds interface information and a state machine 591 from the interface-definition-prescribing information 155. Next, a state trace machine 562 determines paths from a start state s of the state machine 591 to an end state e thereof, and then displays a waveform diagram like one denoted by reference numeral 571 in FIG. 14 on the screen of a display unit 565 such as a display unit of a computer by way of a signal-waveform-outputting means 564. The present invention allows a function of a branch state included in the state transitions of the state machine 591. It is possible to determine that plural operation patterns of the function exists at a branch state. It is also possible what point on the waveform diagram corresponds to the branch state. Waveforms after the branch point are determined by the operation pattern. Assume for example that the state machine 591 allows 2 possible signal-value combinations B and F to follow a signal-value combination A. In this case, a symbol 581 indicating the existence of another operation pattern is displayed at the branch point on the waveform diagram 571 on the display unit 565. A branch-state-detecting means 563 detects such a branch point and displays a branch-point symbol 581 thereat.

In an implementation of the waveform display system on a computer, a branch-point symbol 582 displayed on the display unit 565 can be selected by using an input device such as a mouse. When branch-point symbol 582 is selected, a waveform select window 584 is displayed on the display unit 565, being superposed on the displayed waveform diagram to result in a screen 572 shown in FIG. 14. Selection items on the waveform select window 584 correspond to paths or state transitions to states B and F from a branch state of the state machine 591 and the branch state corresponds to the branch-point symbol 582. The value of an rdwt signal in the state transition to the state B corresponding to the signal-value combination B is different from the value of the same signal in the state transition to the state F corresponding to the signal-value combination F as indicated by the selection items on the waveform select window 584. At that time, if the selection item 583 is specified by using an input device such as a mouse, a command is given to the state machine 591 to transit from the branch state A to the state F. By tracing state transitions of the state machine 591 for observing different waveforms in accordance with commands entered by the user as described above, operation waveforms 573 of a transition from the branch state A to the state F are displayed on a display unit 585 so that the user is capable of knowing possible operation waveforms of the logic circuit 551. In addition, since impossible operation waveforms are not displayed, the user does not misunderstand the operation of the logic circuit 551.

It should be noted that the waveform select window 584 allows the user not only to specify a selection item among a collection on the window 584, but also to examine what combinations of waveforms following the branch-point symbol 582 are possible. In addition, by collecting identifier names of function-definition-prescribing information from the interface-definition-prescribing information and displaying the identifier names to the user, it is possible to express what functions the current logic circuit has. At the same time, by building a state machine like the one denoted by reference numeral 591 for a function represented by an identifier name selected by the user and displaying a waveform diagram of the state machine on a display unit, it is possible to present an operation waveform for a function desired by the user.

Figure 16:
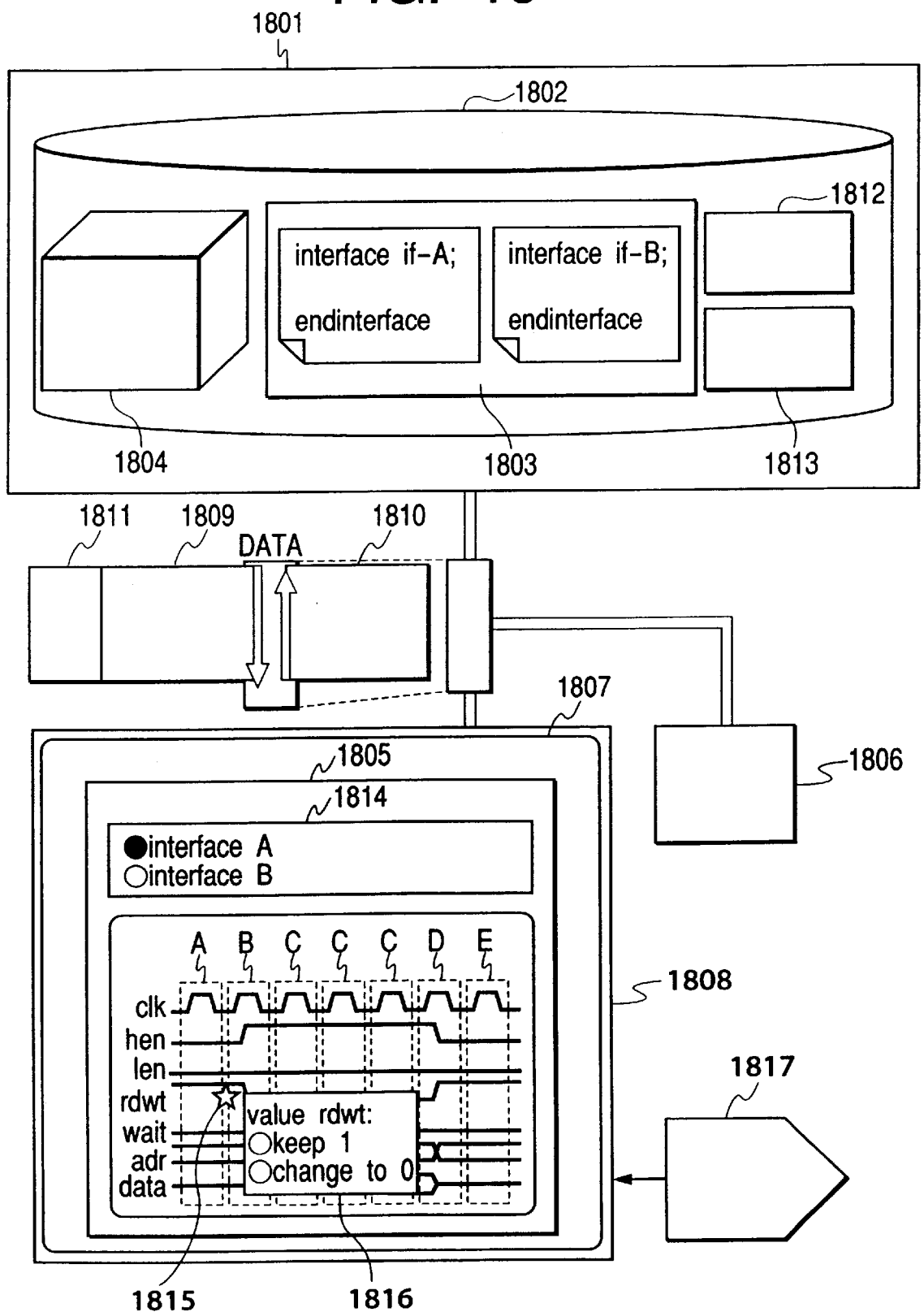
FIG. 16 is a diagram showing a typical embodiment implementing the interactive waveform display system.

FIG. 16 is a diagram showing a typical embodiment implementing the interactive waveform display system explained above by referring to FIGS. 14 and 15. The embodiment is an implementation of the interactive waveform display system in a computer network. As shown in FIG. 16, a server 1801 includes a storage medium 1802 for storing an interface-definition-prescribing information 1803 and an execution program 1804 of the interactive waveform display system. The interface-definition-prescribing information 1803 and the execution program 1804 are stored in a format executable by using typically a web browser 1805.

By using the web browser 1805, the user is capable of making an access to the interface-definition-prescribing information 1803 stored in the storage medium 1802 employed in the server 1801 for any arbitrary desired piece of interface-definition-prescribing information. At that time, all or part of the execution program 1804 of the interactive waveform display system is loaded into the web browser 1805 used by the user. Then, a waveform representing interface-definition-prescribing information can be displayed on a display unit 1807. The interactive waveform display system is capable of receiving an input from the user through the network and changing a waveform instantly in accordance with the input. By allowing plural users to make accesses to the server through an electronic network such as the Internet, it is possible to use the interactive waveform display system for disclosing specifications of a logic circuit to the users, selling a logic circuit to the users, searching a database for a logic circuit and as a facility of studying specifications of a logic circuit. That is, it is not necessary to provide the server 1801 and the display unit 1807 for only a single user. To be more specific, the server 1801 is provided for a provider of interface information while the display unit 1807 is provided for a recipient of the interface information. Of course, users of the server 1801 include the user of only a memory or a processing unit of the server 1801 in addition to the user of the server 1801 itself. In addition, in spite of the fact that the provider of interface information is essentially different from a person providing an IP core of the provided interface information, in many cases, participation by the person providing the IP core is necessary in creation of interface information in the IP core. Thus, the provider of interface information is virtually regarded as the same as the person providing an IP core.

The server is connected to a display unit by a communication means such as the Internet, a public telephone line or a dedicated line. In such a communication configuration, the IP-core recipient is capable of receiving interface information provided by the IP-core provider by way of the information transmission media such as the public telephone line. Of course, as described earlier, the interface information can also be delivered by using recording media. In this case, since the recording media for storing interface information needs to be created and the recording media itself is delivered, however, it takes a long time to deliver the interface information in comparison with the delivery through the Internet. Even in the case of interface information delivered by using the Internet or a dedicated line, nevertheless, it is obvious that the information provider owns a recording medium provided by the present invention in the server. In addition, the recipient of the interface information provided by the present invention also owns a recording medium used virtually for recording the interface information in the processing apparatus owned by the provider.

The present invention's other embodiment using a network is a logic-circuit-searching system. In the logic-circuit-searching system, the server has a set of interface-information-recording media and a waveform editor program whereas the user has a web browser connected to the server by a network. The user activates the waveform editor program on the web browser and enters a desired series of signals to the server through the editor. At the end of the operation carried out by the user to enter the desired series of signals, an end notification is transmitted to the server. Receiving the end notification, the server searches the interface-information set for interface information having the same waveform as the desired series of signals. If such interface information is found, the server sends a message to the web browser used by the user to inform the user of the existence of a logic circuit having the desired series of signals. If such interface information is not found, on the other hand, the server sends a message to the web browser used by the user to inform the user of the non-existence of a logic circuit having the desired series of signals or transmits data of a logic circuit outputting a series of signals similar to the desired one. A series of signals is considered to be similar to another series of signals in accordance with the present invention if some signal values in one series are inverted values of counterparts in the other series or there are only few differences in transfer timing between the two series.

Figure 17:
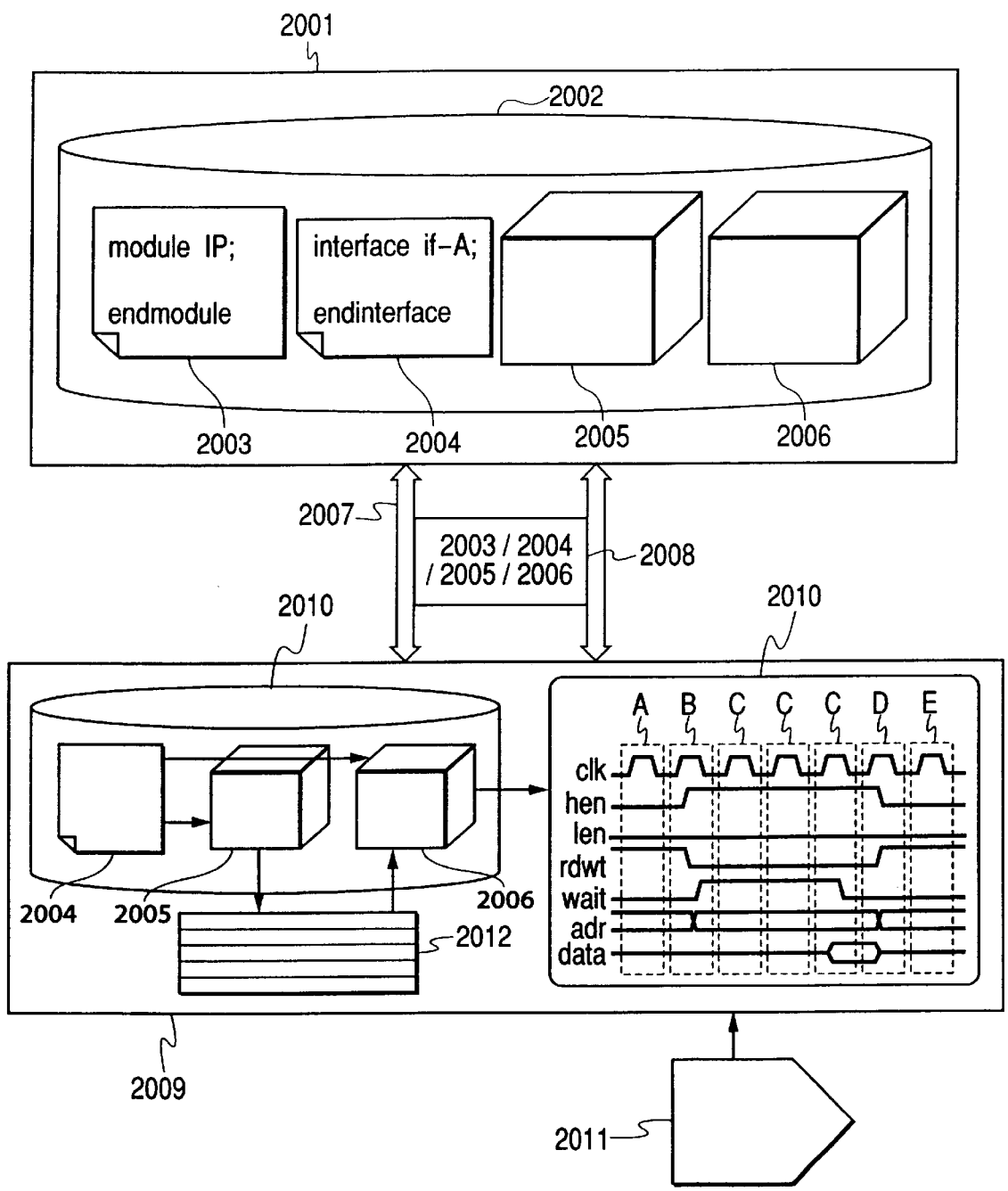
FIG. 17 is an explanatory diagram showing data and software loaded into a user computer in one of the embodiments of the present invention.

FIG. 17 is an explanatory diagram showing data and software loaded into a user computer in one of the embodiments of the present invention. As shown in the figure, in a server computer 2001, a storage medium 2002 is used for storing interface-definition-prescribing information 2004, logic-circuit information 2003, data-creating software 2005 and processing software 2006. The data-creating software 2005 is used for creating data to be stored in a memory as a result of decoding the interface-definition-prescribing information 2004 while the processing software 2006 is to be executed for carrying computation by reading out the interface-definition-prescribing information 2004. All or part of the information stored in the storage medium 2002 is downloaded to a storage medium employed in a user computer 2009. As an alternative, the information can be transferred to the storage medium of the user computer 2009 by mailing a portable storage medium such as a floppy disc. In the user computer 2009, the data-creating software 2005 is executed for creating data that can be processed by the user computer 2009 from the interface-definition-prescribing information 2004. The data is stored in a temporary memory 2012. Then, the processing software 2006 is executed for carrying out computation by reading out the interface-definition-prescribing information 2004. A result of processing by execution of the processing software 2006 is displayed on an execution-result display unit 2010. It should be noted that the interface-definition-prescribing information 2004, the data-creating software 2005 and the processing software 2006 can also be created on the user computer 2009 instead of downloading or transferring from the storage medium 2002 employed in the server computer 2001. That is, the interface-definition-prescribing information 2004 and the processing software 2006 can be changed in accordance with a judgment formed by the user and the result can then be displayed on the execution-result display 2010. In this embodiment, ports of a logic circuit are grouped into plural port sets and an interface is defined for each of the port sets.

Figure 18:
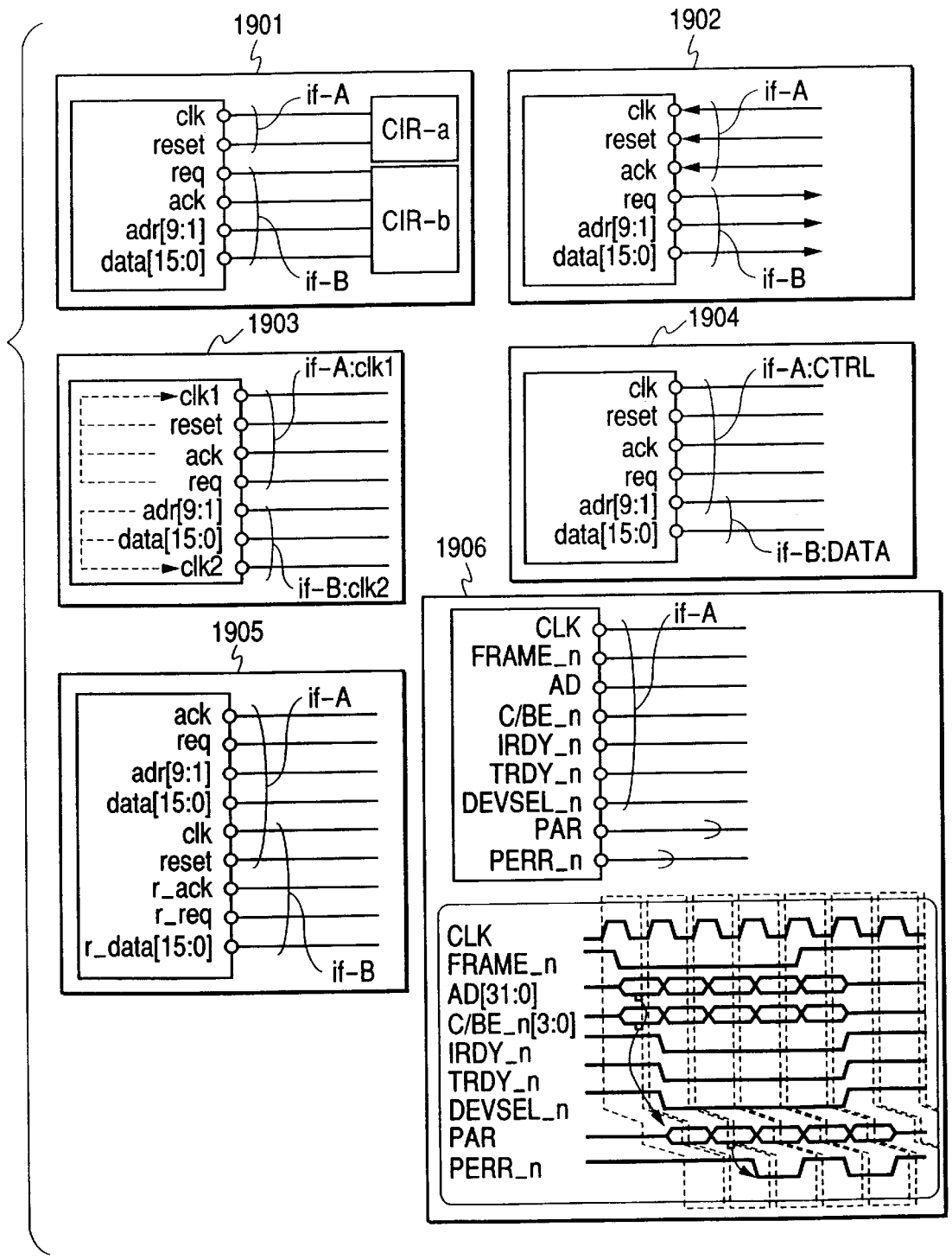
FIG. 18 is a diagram showing a method of classifying ports of a logic circuit.

FIG. 18 is a diagram showing a method of classifying ports of a logic circuit. In the present invention, it is assumed that classifications are each adopted independently of each other or a combination of classifications is embraced. In accordance with a classification 1901, ports are categorized by destination logic circuit to which signal lines of the logic circuit are connected. With this classification 1901, if a destination logic circuit is changed, a range affected by the change can be limited to a set of ports connected to the destination logic circuit. In accordance with a classification 1902, ports are categorized in dependence on whether the direction is an input direction or an output direction. With this classification 1902, interfaces of a logic circuit inputting data independently from operations to output data can be defined with ease. In accordance with a classification 1903, ports are categorized by clock signal changing values of signals. With this classification 1903, an interface of a logic circuit having plural sub-logic circuits can be defined with ease for each of the sub-logic circuits. In accordance with a classification 1904, ports are categorized into ports for control lines and ports for data lines. An interface for data lines is not affected by data read out or written in simple operations through the data lines. Interfaces can thus be defined with ease by separating the data lines from the rest. If address lines of a logic circuit are used in simple accesses wherein signal transitions are not affected by values of signals, the address lines can be categorized in the same way as the address lines. In accordance with a classification 1905, ports are categorized in dependence on whether the value of a signal for a port changes when the logic circuit makes a request for a transfer or when the logic circuit responds to a request. In the case of a signal output by a CPU, for example, the value of the signal changes when the CPU makes a request for a transfer of data. A port of such a signal is categorized as an on-request signal-line port. In the case of a signal output by a peripheral device such a memory, on the other hand, the value of a signal changes when the peripheral device responds to a request made by a destination logic circuit. A port of such a signal is categorized as an on-response signal-line port. This classification 1905 is applicable to a logic circuit wherein an on-request module with the function to make a request coexists with an on-response module with the function to respond to an incoming request. That is, the classification 1905 allows interfaces to be defined individually for an on-request module and an on-response module, which are included in the logic circuit. In accordance with a classification 1906, ports are categorized by signal delay quantity. A delay quantity of a signal is treated by adoption of one of the following 2 techniques. In accordance with one of the techniques, a delay quantity is treated as a time delay within a clock period with respect to a value transition of a clock signal. Typically, a delay quantity with respect to a value transition of a clock signal can be in a range of the first ⅓ of the clock period, a range of the second ⅓ of the clock period or a range of the last ⅓ of the clock period. The other technique is adopted for a logic circuit carrying out pipeline processing. In this case, a certain signal lags behind a preceding signal by a delay time expressed in terms of clock cycles. The other technique of the classification 1906 in this embodiment is used to exemplify a PCI transaction wherein PAR and PERR_n signals always lag behind by 1 and 2 clock cycles respectively as shown in FIG. 18. Thus, interfaces are defined to reflect information by putting the PAR and PERR_n signals in categories separated from the other signals.

So far, the techniques for prescribing interface information for a logic circuit presented as an IP module have been explained. In the design of a system LSI, there is adopted a technique whereby plural IP modules are combined and created on a single semiconductor chip. In this case, some of the IP modules may be obtained from another IP-module vendor. By applying the present invention to such a case, behaviors of all interface signals can be expressed, making the design of the system LSI simple. In addition, the present invention allows a designer of the LSI system to obtain complete interface information of the IP modules presented in a computer system. Moreover, in comparison with the conventional method, the amount of work to produce a manual of the presented IP modules is small. Furthermore, the present invention defines ports of an IP module by grouping the ports into plural port sets, reducing the amount of work to be done by the producer of IP modules. Thus, the time required to present a system LSI to an LSI user is short in comparison with the conventional method. As a result, by implementing the present invention, it is possible to offer benefits to the system-LSI user, the system-LSI designer designing a system LSI for the user and the IP-module producer producing IP modules for the system LSI-designer.

A variety of embodiments of the present invention have been described above. It should be noted, however, that the scope of the present invention is not limited by the embodiments. That is, the embodiments can be modified as long as the changes fall within a range not departing from the true spirit of the present invention.

Since information stored in the storage medium provided by the present invention includes a prescription of signal-value combinations each covering a port set excluding only few different ports, it is not necessary to redefine an interface for a port already defined in the stored information. Thus, the number of man-months required for defining interfaces and the storage capacity of the storage medium can be reduced.

In addition, in the case of a circuit module having plural interfaces, a correlation showing an execution sequence of functions of the interfaces can be expressed without defining the interface as a whole.

Furthermore, it is possible to express a protocol where events always occur at intervals each consisting of a fixed number of cycles.

Moreover, by adding attributes for each function, the additional information is useful to the user of the circuit module and useful for computer processing. A flag is used to indicate a level at which a function can be disclosed to the user so that the disclosure of a function to the user can be limited. By using a flag to indicate whether or not to a sequential relation among functions is expressed, contradictions and interpretation ambiguity caused by multiplexing of sequential relations among functions can be avoided. A flag is used to indicate whether or not an interrupt has been generated so that an interrupt can be recognized with a high degree of accuracy. By using a flag to indicate whether or not an operation can be restarted from the beginning of the function, an operation discontinuation such as a reset and an interrupt necessitating a return to the beginning of the function can be expressed.

The present invention is not limited to the above embodiments and various changes and modifications can be made within the spirit and scope of the present invention. Therefore, to appraise the public of the scope of the present invention, the following claims are made.

What is claimed is:

1. A computer-readable storage medium used for storing a circuit module's interface information comprising high-level combinations, each combination including first identifier sets and second identifier sets where:
   each of said first identifier sets is a combination pattern of values of signals, each signal appearing at a predetermined time at one of ports pertaining to a first port set of said circuit module; and
   each of said second identifier sets is a combination pattern of values of signals, each signal appearing at a predetermined time at one of ports pertaining to a second port set of said circuit module.

2. The computer-readable storage medium according to claim 1 wherein said first and second port sets serve as first and second interfaces respectively.

3. The computer-readable storage medium according to claim 2 wherein a start point of time and an end point of time of a group-level function of said first interface as well as a start point of time and an end point of time of a group-level function of said second interface are also stored.

4. The computer-readable storage, medium according to claim 1 wherein information on a delay of said first port set with respect to said second group is stored.

5. The computer-readable storage medium according to claim 1 wherein information prescribed in each of said high-level combinations, each combination including said first identifier sets associated with said first port set and said second identifier sets associated with said second port set, defines an intergroup-level function of said circuit module.

6. The computer-readable storage medium according to claim 1 wherein information prescribing a module-level function of said circuit module is also stored.

7. A connection-verifying method for determining whether or not a first circuit module can be connected to a second circuit module, said connection-verifying method comprising the processing steps of:
   verifying existence of a relation between a function of said first circuit module and a function of said second circuit module; and
   finding arrival steps of said function of said first circuit module and said function of said second circuit module by using a chronological array of identifiers representing said function of said first circuit module, and another chronological array of identifiers representing said function of said second circuit module; and
   determining whether or not said first circuit module can be connected to said second circuit module depending on whether or not said arrival step of said function of said first circuit module overlaps said arrival step of said function of said second circuit module,
   wherein:
   said processing steps are based on interface information of said first circuit module and interface information of said second circuit module;
   said interface information of said first circuit module comprises high-level combinations, each combination including first identifier sets and second identifier sets where:
      each of said first identifier sets is a combination pattern of values of signals, each signal appearing at a predetermined time at one of ports pertaining to a first port set of said first circuit module, whereas
      each of said second identifier sets is a combination pattern of values of signals, each signal appearing at a predetermined time at one of ports pertaining to a second port set of said second circuit module; and
   said interface information of said second circuit module comprises high-level combinations, each combination including third identifier sets and fourth identifier sets where:
      each of said third identifier sets is a combination pattern of values of signals, each signal appearing at a predetermined time at one of ports pertaining to a third port set of said second circuit module, whereas
      each of said fourth identifier sets is a combination pattern of values of signals, each signal appearing at a predetermined time at one of ports pertaining to a fourth port set of said second circuit module.

8. A presentation method for a circuit module's interface information comprising high-level combinations, each com bination including first identifier sets and second identifier sets, said method comprising presenting said circuit module's interface information, where:

each of said first identifier sets is a combination pattern of values of signals, each signal appearing at a predetermined time at one of ports pertaining to a first port set of said circuit module; and each of said second identifier sets is a combination pattern of values of signals, each signal appearing at a predetermined time at one of ports pertaining to a second port set of said circuit module.

9. The presentation method according to claim 8 wherein said first and second port sets serve as first and second interfaces respectively.

10. The presentation method according to claim 8 wherein information prescribed in each of said high-level combinations, each combination including said first identifier sets associated with said each port set and said second identifier sets associated with said second port set, defines an intergroup-level function of said circuit module.

* * * * *

UNITED STATES PATENT AND TRADEMARK OFFICE
CERTIFICATE OF CORRECTION

PATENT NO.    : 6,625,789 B2
DATED         : September 23, 2003
INVENTOR(S)   : Koji Ara, Kei Suzuki and Kazoo Yano It is certified that error appears in the above-identified patent and that said Letters Patent is hereby corrected as shown below:

<u>Title page,</u>
Add the following item -- [30] Foreign Application Priority Data
April 14, 2000 (JP).....................2000-118488 --.

Signed and Sealed this

Ninth Day of March, 2004

JON W. DUDAS
*Acting Director of the United States Patent and Trademark Office*